(12) United States Patent
Kwon et al.

(10) Patent No.: US 11,899,741 B2
(45) Date of Patent: Feb. 13, 2024

(54) MEMORY DEVICE AND METHOD

(71) Applicant: Samsung Electronics Co., Ltd., Suwon-si (KR)

(72) Inventors: Hyung-Dal Kwon, Hwaseong-si (KR); Seung Wook Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 107 days.

(21) Appl. No.: 16/856,380

(22) Filed: Apr. 23, 2020

(65) Prior Publication Data

US 2021/0089610 A1    Mar. 25, 2021

(30) Foreign Application Priority Data

Sep. 19, 2019    (KR) .................. 10-2019-0115443

(51) Int. Cl.
| | |
|---|---|
| *G06F 17/15* | (2006.01) |
| *G06F 7/544* | (2006.01) |
| *G06F 17/14* | (2006.01) |
| *G06F 17/16* | (2006.01) |
| *G06F 13/28* | (2006.01) |
| *H03H 17/02* | (2006.01) |

(52) U.S. Cl.
CPC ............ *G06F 17/15* (2013.01); *G06F 7/5443* (2013.01); *G06F 13/28* (2013.01); *G06F 17/14* (2013.01); *G06F 17/16* (2013.01); *H03H 17/0213* (2013.01)

(58) Field of Classification Search
CPC ........ G06F 17/15; G06F 17/16; G06F 7/5443; G06F 17/14–16; G06F 15/7821; G06F 15/785; G06N 3/00; G06N 3/04; G06N 3/063; G06N 3/08; H03H 17/0213; G06G 7/16
See application file for complete search history.

(56) References Cited

U.S. PATENT DOCUMENTS

| | | | |
|---|---|---|---|
| 2017/0344876 A1 | 11/2017 | Brothers | |
| 2019/0042923 A1 | 2/2019 | Janedula et al. | |
| 2020/0349217 A1* | 11/2020 | Luo | ...................... G06F 9/30032 |

FOREIGN PATENT DOCUMENTS

| | | |
|---|---|---|
| CN | 109767000 A | 5/2019 |
| KR | 10-2017-0135752 A | 12/2017 |
| KR | 10-2019-0048073 A | 5/2019 |

OTHER PUBLICATIONS

Zhao, Yulin. "(PDF) a Faster Algorithm for Reducing the Computational Complexity of Convolutional Neural Network." Researchgate.net, 2018, https://www.researchgate.net/publication/328369786_A_Faster_Algorithm_for_Reducing_the_Computational_Complexity_of_Convolutional_Neural_Networks. (Year: 2018).*

Sze, Vivienne, et al., "Efficient Processing of Deep Neural Networks: A Tutorial and Survey", *Proceedings of the IEEE*, 105, 12, 2017 (pp. 2295-2329).

(Continued)

*Primary Examiner* — Matthew D Sandifer
*Assistant Examiner* — Huy Duong
(74) *Attorney, Agent, or Firm* — NSIP Law

(57) ABSTRACT

A memory device includes a memory configured to store input data and filter data for a convolution operation, and a function processor configured to, in response to a read command of at least a portion of data from among the input data and the filter data, transform the at least a portion of the data based on a parameter of the convolution operation during a clock cycle corresponding to the read command and output a corresponding transformation result as transformed data.

36 Claims, 16 Drawing Sheets

(56) References Cited

OTHER PUBLICATIONS

Lin, Jilan, et al., "CNNWIRE: Boosting Convolutional Neural Network with Winograd on ReRAM based Accelerators," *Proceedings of the 2019 on Great Lakes Symposium on VLSI*. May 9-11, 2019 (pp. 283-286).

Extended European Search Report dated Feb. 8, 2021 in counterpart European Patent Application No. 20190373.9 (8 pages in English).

Lavin, Andrew et al., "Fast Algorithms for Convolutional Neural Networks", *Proceedings of the IEEE Conference on Computer Vision and Pattern Recognition*. 2016 (pp. 1-9).

Li, Sheng et al., "Enabling Sparse Winograd Convolution by Native Pruning", *arXiv preprint arXiv:1702.0859*, Oct. 13, 2017 ( 8 pages in English).

Vincent, Kevin, et al. "On Improving the Numerical Stability of Winograd Convolutions", *ICLR 2017*, 2017 (pp. 1-4).

Jia, Zhen, et al. "Optimizing N-dimensional, Winograd-Based Convolution for Manycore CPUs." *Proceedings of the 23rd ACM SIGPLAN Symposium on Principles and Practice of Parallel Programming*. 2018 (pp. 1-15).

Liu, Xingyu et al., "Efficient Sparse-Winograd Convolutional Neural Networks", *arXiv preprint arXiv:1802.06367*, Feb. 18, 2018 (pp. 1-10).

"3.3 Processor in Memory (PIM)", The Magazine of the IEIE vol. 45, No. 1, 2018 (1 page in English and 104 pages in Korean).

Iodice, Gian Marco., "Even Faster CNNS: Exploring the New Class of Winograd Algorithms", *Embedded Vision Summit 2018*, May 22, 2018 (pp. 1-52).

Xygkis, Athanasios, et al. "Efficient Winograd-Based Convolution Kernel Implementation on Edge Devices." *2018 55th ACM/ESDA/IEEE Design Automation Conference (DAC)*. IEEE, 2018 (pp. 1-6).

Zlateski, Aleksandar, et al. "A Deeper Look at FFT and Winograd Convolutions." 2018 (pp. 1-3).

Meng, Lingchuan, et al.,. "Efficient Winograd Convolution via Integer Arithmetic." *arXiv preprint arXiv:1901.01965*, Jan. 7, 2019, (pp. 1-9).

Barabasz, Barbara et al., "Error Analysis and Improving the Accuracy of Winograd Convolution for Deep Neural Networks", arXiv preprint arXiv:1803.10986, May 1, 2019 (pp. 1-37).

* cited by examiner

MEMORY DEVICE AND METHOD

CROSS-REFERENCE TO RELATED APPLICATIONS

This application claims the benefit under 35 USC § 119(a) of Korean Patent Application No. 10-2019-0115443 filed on Sep. 19, 2019 in the Korean Intellectual Property Office, the entire disclosure of which is incorporated herein by reference for all purposes.

BACKGROUND

1. Field

The following description relates to a memory device and method.

2. Description of Related Art

In general, a system for performing a convolution operation or a matrix operation may move data stored in a memory to a high-speed operation processor, for example, a central processing unit (CPU), a graphics processing unit (GPU), a digital signal processor (DSP), or a neural processing unit (NPU), and may store the resulting data in the memory.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a memory device includes a memory configured to store input data and filter data for a convolution operation, and a function processor configured to, in response to a read command of at least a portion of data from among the input data and the filter data, transform the at least a portion of the data based on a parameter of the convolution operation during a clock cycle corresponding to the read command and output a corresponding transformation result as transformed data.

The function processor may include an input data transform circuit configured to transform at least a portion of the input data and output a corresponding transformation result as transformed input data, and the input data transform circuit may be structured based on the parameter of the convolution operation and a type of an algorithm applied to transform the at least a portion of the input data to reduce a computational quantity of the convolution operation.

An input transform matrix may be determined based on both the parameter of the convolution operation and the type of the algorithm, and the input data transform circuit may be structured to correspond to the input transform matrix.

The function processor may include a filter data transform circuit configured to transform at least a portion of the filter data and output a corresponding transformation result as transformed filter data, and the filter data transform circuit may be structured based on the parameter of the convolution operation and a type of an algorithm applied to transform the at least a portion of the filter data to reduce a computational quantity of the convolution operation.

The filter transform matrix may be determined based on both the parameter of the convolution operation and the type of the algorithm, and the filter data transform circuit may be structured to correspond to the filter transform matrix.

The filter data stored in the memory may include filter data transformed based on the parameter of the convolution operation, and when the filter data is the filter data transformed based on the parameter of the convolution operation, the function processor may be configured to output the transformed filter data without further transforming the transformed filter data.

The function processor may include a multiplier accumulator (MAC) configured to perform an operation between the transformed input data and the transformed filter data.

The function processor may be configured to, in response to a write command of at least a portion of intermediate output data that is output through an operation between the transformed input data and the transformed filter data, transform the at least a portion of the intermediate output data based on the parameter of the convolution operation during a clock cycle corresponding to the write command, and output a corresponding transformation result as transformed intermediate output data.

The intermediate output data may include output data of an elementwise multiplication between the transformed input data and the transformed filter data.

The function processor may include an output data transform circuit configured to transform the at least a portion of the intermediate output data and output a corresponding transformation result as transformed output data, and the output data transform circuit may be structured based on the parameter of the convolution operation and a type of an algorithm that transforms data to reduce a computational quantity of the convolution operation.

The output transform matrix may be determined based on the parameter of the convolution operation and the type of the algorithm, and the output data transform circuit may be structured to correspond to the output transform matrix.

The parameter of the convolution operation may be determined based on any one or any combination of any two or more of a size of output data, a size of filter data, a size of input data, a stride interval, and a padding size.

The function module may include either one or both of an adder and a shifter.

The algorithm that transforms the input data to reduce the computational quantity of the convolution operation may be a Winograd algorithm.

The algorithm that transforms the input data to reduce the computational quantity of the convolution operation may be a Strassen algorithm.

The function processor may include a pruning circuit configured to output a predetermined value in response to a size of the transformed input data being less than or equal to a threshold.

The function processor may be configured to compute a value of a nonlinear function to determine whether to activate the transformed filter data.

The function processor may include an operation processor configured to perform an operation using the transformed input data and the transformed filter data.

The operation processor may include a multiplier configured to perform an elementwise multiplication using the transformed input data and the transformed filter data.

The function module may include two or more of an input data transform circuit configured to transform and output at least a portion of the input data, a filter data transform circuit configured to transform and output at least a portion of the filter data, a multiplier configured to perform a multiplication using the transformed input data and the transformed filter data, and an output data transform circuit configured to transform and output at least a portion of intermediate output data output by performing the multiplication.

In another general aspect, a computing apparatus includes a memory configured to store input data and filter data for a convolution operation, a function processor configured to, in response to a read command of at least a portion of data from among the input data and the filter data, transform the at least a portion of the data based on a parameter of the convolution operation during a clock cycle corresponding to the read command and output a corresponding transformation result as transformed data, and a direct memory access (DMA) processor configured to align and store the at least a portion of the data in the memory based on a connection relationship between the memory and the function processor.

The function processor may include the input data transform circuit configured to transform the at least a portion of the input data and output a corresponding transformation result as transformed input data, and the input data transform circuit may be structured based on the parameter of the convolution operation and a type of an algorithm applied to transform the at least a portion of the input data to reduce a computational quantity of the convolution operation.

An input transform matrix may be determined based on a combination of the parameter of the convolution operation and the type of the algorithm, and the input data transform circuit may be structured to correspond to the input transform matrix.

The function processor may include the filter data transform circuit configured to transform the at least a portion of the filter data and output a corresponding transformation result as transformed filter data, and the filter data transform circuit may be structured based on the parameter of the convolution operation and a type of an algorithm applied to transform the at least a portion of the filter data to reduce a computational quantity of the convolution operation.

The computing apparatus may further include an operation processor configured to perform an operation using the transformed input data and the transformed filter data.

The operation processor may include any one or any combination of any two or more of a central processing unit (CPU), a graphics processing unit (GPU), a digital signal processor (DSP), a neural processing unit (NPU), and a field programmable gate away (FPGA).

The function processor may be configured to, in response to a write command of at least a portion of intermediate output data that is output through an operation using the transformed input data and the transformed filter data, transform the at least a portion of the intermediate output data based on the parameter of the convolution operation during a clock cycle corresponding to the write command and output a corresponding transformation result as transformed intermediate output data.

The function processor may include the output data transform circuit configured to transform the at least a portion of the intermediate output data and output a corresponding transformation result as transformed intermediate output data, and the output data transform circuit may be structured based on the parameter of the convolution operation and a type of an algorithm that transforms the intermediate output data to reduce a computational quantity of the convolution operation.

In another general aspect, a processor-implemented operation method of a memory device includes receiving at least a portion of data from among input data and filter data from a memory in response to a read command, and transforming the at least a portion of the data based on a parameter of a convolution operation during a clock cycle corresponding to the read command and outputting a corresponding transformation result as transformed data.

The outputting may include determining an input transform matrix based on a combination of the parameter of the convolution operation and a type of an algorithm that transforms at least a portion of the input data to reduce a computational quantity of the convolution operation, and transforming the at least a portion of the input data based on the input transform matrix and outputting a corresponding transformation result as transformed input data.

The outputting may include determining a filter transform matrix based on a combination of the parameter of the convolution operation and a type of an algorithm that transforms at least a portion of the filter data to reduce a computational quantity of the convolution operation, and transforming the at least a portion of the filter data based on the filter transform matrix and outputting a corresponding transformation result as transformed filter data.

The method may further include in response to a write command of at least a portion of intermediate output data that is output through an operation between the transformed input data and the transformed filter data, transforming the at least a portion of the intermediate output data based on the parameter of the convolution operation and storing the same in the memory during a clock cycle corresponding to the write command.

The storing in the memory may include determining an output transform matrix based on both the parameter of the convolution operation and a type of an algorithm that transforms the at least a portion of the intermediate output data to reduce a computational quantity of the convolution operation, and transforming the at least a portion of the intermediate output data based on the output transform matrix and storing the same in the memory.

In another general aspect, a non-transitory computer-readable storage medium stores instructions that, when executed by one or more processors, cause the one or more processors to perform the method described above.

In another general aspect, a computing apparatus includes one or more processors configured to, in response to a read command of at least a portion of data among input data and filter data stored in a memory including a function-in-memory (FIM), transform at least a portion of the data based on a parameter of the convolution operation during a clock cycle corresponding to the read command and output a corresponding transformation result as transformed data.

The memory may be configured to store the input data and the filter data.

The computing apparatus may further include a direct memory access (DMA) processor configured to align and store the at least a portion of the data in the memory based on a connection relationship between the memory and the one or more processors.

The one or more processors may include a multiplier accumulator (MAC) configured to perform an operation between the transformed input data and the transformed filter data.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
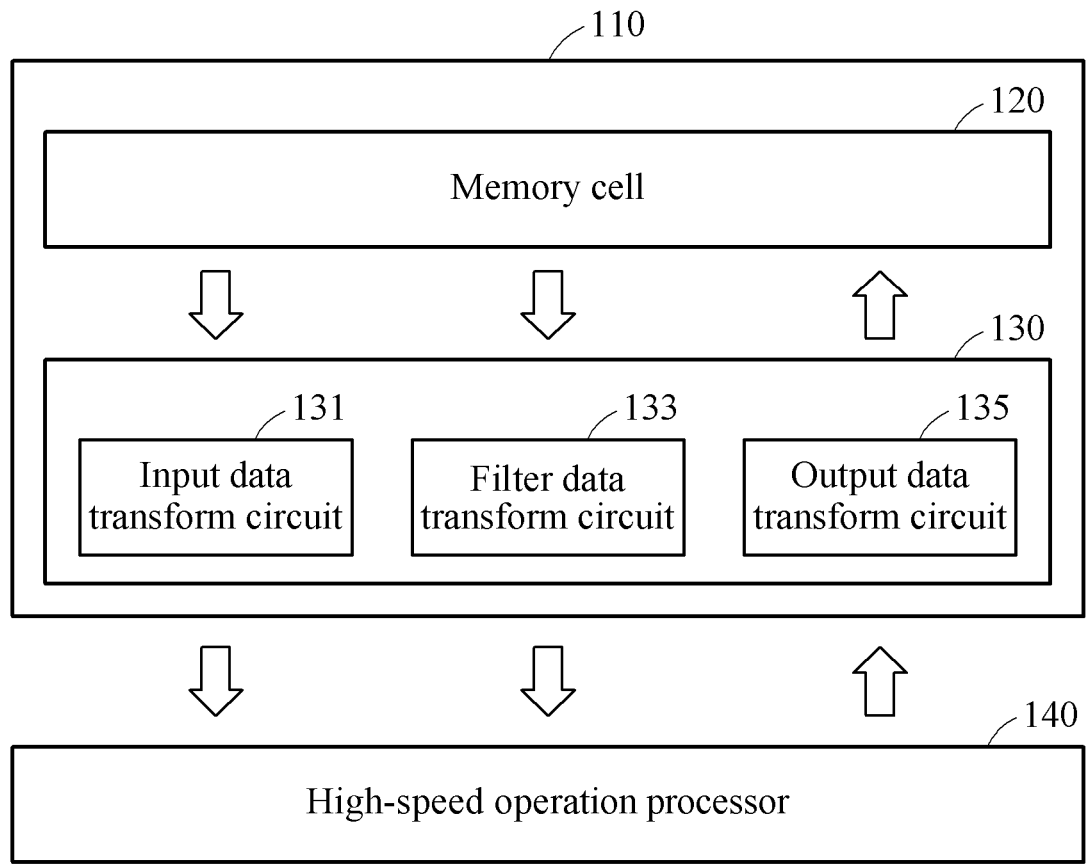
FIG. 1 illustrates an example system for performing a convolution operation or a matrix operation.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Also, in the description of examples, detailed description of well-known related structures or functions will be omitted when it is deemed that such description will cause ambiguous interpretation of the present disclosure.

The examples may be configured as, or in, in various types of products, for example, a personal computer (PC), a laptop computer, a tablet computer, a smartphone, a television (TV), a smart electronic device, a smart vehicle, a kiosk, and a wearable device. Hereinafter, the examples are described with reference to the accompanying drawings. Reference numerals in the drawings refer to like elements throughout.

The features of the examples described herein may be combined in various ways as will be apparent after an understanding of the disclosure of this application. Further, although the examples described herein have a variety of configurations, other configurations are possible as will be apparent after an understanding of the disclosure of this application. It is also noted that use of the term "may" with respect to an example or embodiment, e.g., as to what an example or embodiment may include or implement, means that at least one example or embodiment exists where such a feature is included or implemented while all examples and embodiments are not limited thereto.

In alternative systems, a typical memory that stores data and an operation processor that processes an operation are separate from one another. To process the data stored in the memory, the data is moved to and then processed at the operation processor. To process a complex operation, a CPU uses many instructions and requires relatively large amount of processing time. If a specific accelerator, for example, a graphics processing unit (GPU), a neural processing unit (NPU), and a digital signal processor (DSP), is used as the operation processor, and, in such an example, an operation not processible at a corresponding typical device is present, data may be moved to the CPU and processed at the CPU. Therefore, a processing speed may significantly decrease. Further, in a typical system that requires preprocessing and postprocessing, for example, an addition and a subtraction, the operation processor may be incapable of processing corresponding preprocessing or postprocessing in a limited number or only one clock cycle.

FIG. 1 illustrates an example system for performing a convolution operation or a matrix operation.

Referring to the example of FIG. 1, the system, also referred to as "system according to an example" or simply "system," for performing a convolution operation or a matrix operation may include a memory device 110 and a high-speed operation processor 140 according to one or more embodiments. The system according to a non-limiting example may be, for example, a computing apparatus configured to perform the convolution operation or the matrix operation.

A convolution may include multiplying a single function by a value inverted from another function and by integrating a multiplication result over an interval. In example machine learning examples, herein the convolution operation may refer to an operation of selecting a filter corresponding to a given purpose and extracting a specific feature corresponding to input data by scanning all of the regions of input data using the selected filter. For example, the system may acquire output data by performing a convolution operation of filter data with respect to input data and each piece of data may be defined in a matrix form. When data is defined in such a matrix form, the convolution operation may be performed as a matrix operation.

The matrix operation may include any possible arithmetic operations performed between a plurality of matrices. Non-limiting examples of such matrix operations include a matrix addition and subtraction, a scalar matrix multiplication, a matrix multiplication, and an elementwise matrix multiplication. Further, the matrix operation may include operations representable in a form of a matrix, for example, a linear equation.

The convolution operation may be characterized as a combination of a matrix addition and subtraction and a matrix multiplication. In such an example, an amount of time and power used for the matrix multiplication may be significantly greater than an amount of time and power used for the matrix addition and subtraction. From perspective of the system, reducing a number of matrix multiplication operations may be a way to improve a convolution operation processing speed and to reduce a power consumption occurring when performing such a convolution operation.

Also, a typical system for performing a convolution operation moves raw data stored in a memory to a high-speed operation processor, such as a central processing unit (CPU), a graphics processing unit (GPU), a digital signal processor (DSP), a neural processing unit (NPU), a field programmable gate array (FPGA), and such a high-speed operation processor processes the data, and stores the processed data in the memory subsequently. In the typical system, the memory that stores data and the operation processor that processes an operation may be separate from one another. To process data stored in the memory, the data may be moved to and processed at the operation processor. Therefore, a relatively large amount of time is used to process the data.

According to one or more embodiments, a system according to the examples may use an algorithm that transforms data and performs the convolution operation to reduce a computational amount used for the convolution operation. For example, such a system may decrease a multiplication complexity of the convolution operation, for example, by decreasing a number of multiplications required for the convolution operation, using a Winograd algorithm. Alternatively, such a system may decrease the multiplication complexity of the convolution operation using a Strassen algorithm. In an example that uses such an algorithm, such as the Winograd algorithm or the Strassen algorithm, preprocessing or postprocessing such as data conversion may be used. Rather, the system may perform corresponding preprocessing or preprocessing using the operation processor.

According to one or more embodiments, a system according to an example may use the memory device 110, embedded with a function module 130, and the memory device 110 may perform preprocessing or postprocessing of an algorithm using the function module 130. The function module 130 may correspond to a function processor, as a non-limiting example. In this manner, it may be possible to increase a processing speed of the convolution or matrix operation and, at the same time, enhance the power efficiency of the high-speed operation processor 140. In further detail, before the high-speed operation processor 140 processes data, the function module 130, for example, in a form of a circuit, included in the memory device 110 may perform preprocessing or postprocessing of the algorithm. As non-limiting examples discussed above, a Winograd or a Strassen algorithm may be used for the processing. Therefore, by using a function module 130, as discussed in further detail, above, a larger amount of data may be processed during the same amount of time, as some or all convolution and/or matrix operations may be performed by the memory device 110 or separate from the one or more of the aforementioned example high-speed operation processors.

The memory device 110 may include a function-in-memory (FIM) capable of performing data storage and data processing. Such a FIM may include a hardware implementation. The function module 130 may perform preprocessing or postprocessing of the algorithm in a clock cycle corresponding to a read command or a write command. Because the function module 130 may be capable of performing preprocessing or postprocessing for the algorithm in the clock cycle corresponding to the read command or the write command, the system according to the example may reduce an amount of time used for preprocessing or postprocessing for the aforementioned typical system approach.

In one example, a clock cycle corresponding to a read command or a write command may correspond to a single cycle of a clock for an operation of the memory device 110. In this example, circuits excluding a multiplier may be included in the function module 130 to complete processing of the function module 130 in the single cycle, which is described in further detail below.

In another example, a clock cycle corresponding to a read command or a write command may correspond to a plurality of cycles of a clock for an operation of the memory device 110. In this example, the function module 130 may include a multiplier. A pipelining scheme may be applied to the memory device 110 to enhance successful management of a latency, which is described in further detail below.

The memory device 110 may include a memory cell 120 and the function module 130. Here, the memory cell 120 may also be referred to as a memory module. The memory cell 120 may store input data, filter data, and output data. The input data may refer to data on which a convolution operation is performed, and may be, for example, pixel data of an image represented in a form of a two-dimensional (2D) function. The filter data may refer to data pertaining a filter used to detect a feature of the input data. For example, the filter data may be a common parameter used to detect a feature of an image. Thus, the filter may alternatively be referred to as a kernel, a mask, a window, and so on, as non-limiting examples of relevant terms to refer to the filter. In general, the filter may be defined in a square matrix such as a matrix with a dimension of (4, 4) or a dimension of (3, 3), but these are merely non-limiting examples and other dimensions of square matrices may be used in other examples and there may be plural filters. The system may generate a feature map by performing a convolution operation on the input data using the filter, at a designated interval. In such an example, the designated interval for moving or sliding the filter across the input data, also referred to as touring the filter, may also be referred to as a stride.

The function module 130 may include a transform circuit configured to process a transform equation used by a Strassen algorithm, a Winograd algorithm, or a modified algorithm thereof, as non-limiting examples. The transform circuit may include an input data transform circuit 131, a filter data transform circuit 133, and an output data transform circuit 135. In response to a read command of at least a portion of the input data, the input data transform circuit 131 may transform and output the at least a portion of the input data in a clock cycle corresponding to the read command for preprocessing of an algorithm. The data transformed by the input data transform circuit 131 may also be referred to as the transformed input data.

In response to the performance of a read command of at least a portion of the filter data, the filter data transform circuit 133 may transform and output the at least a portion of the filter data in a clock cycle corresponding to the read command for preprocessing of the algorithm. The data transformed by the filter data transform circuit 133 may also be referred to as the transformed filter data.

The high-speed operation processor 140 may receive the transformed input data and the transformed filter data and may perform a remaining operation according to the algorithm. As a result, the high-speed operation processor 140 may generate intermediate output data. The high-speed operation processor 140 may include at least one of the CPU, the GPU, the DSP, the NPU, and the FPGA, as discussed in further detail above, but these are merely non-limiting examples. The high-speed operation processor 140 may also be embedded in a memory with at least one of a data transform circuit and a filter transform circuit.

In response to a write command of at least one of the intermediate output data, the output data transform circuit 135 may generate output data by transforming the at least a portion of the intermediate output data in a clock cycle corresponding to the write command for postprocessing of the algorithm, and may store the generated output data in the memory cell 120. The output data may be final result data of the convolution operation performed on the input data and the filter data.

Hereinafter, a Winograd algorithm is described in further detail with reference to the examples of FIGS. 2 and 3, an operation method of a memory device is described with reference to the example of FIG. 4, an operation method of a memory device according to a Winograd algorithm in a one-dimensional (1D) convolution operation is described with reference to the examples of FIGS. 5 to 8, a computing apparatus that includes a direct memory access (DMA) module configured to align and store data is described with reference to the example of FIG. 9, an operation method of a memory device according to a Winograd algorithm in a two-dimensional (2D) convolution operation is described with reference to the examples of FIGS. 10 to 14, a method of reducing an information loss by a division is described with reference to the example of FIG. 15, and an operation method of a memory device according to a Strassen algorithm is described with reference to the example of FIG. 16.

Figure 2:
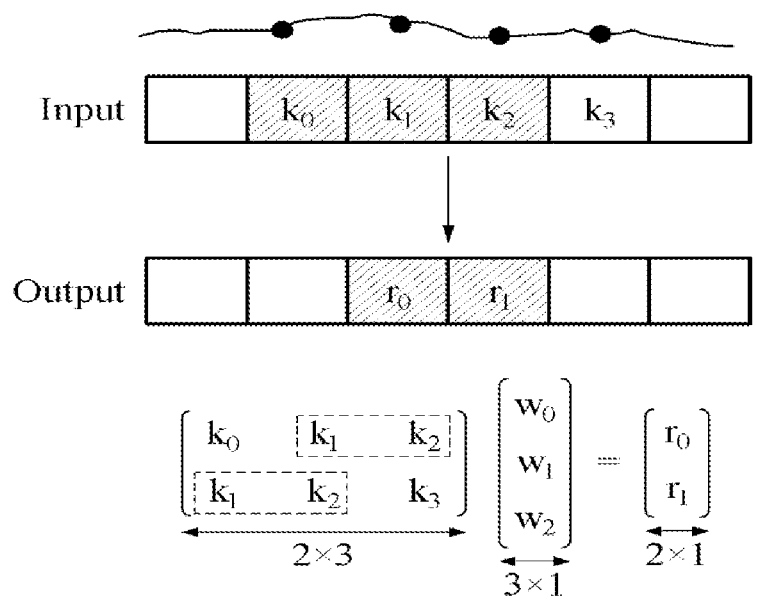
FIG. 2 illustrates an example Winograd algorithm according to a one-dimensional (1 D) convolution operation.

FIG. 2 illustrates an example of a Winograd algorithm according to a 1D convolution operation.

A plurality of methods may be used to perform a convolution operation. If an inverse Fourier transform (IFT) function is applied to a result of multiplying two Fourier transform functions to which the convolution operation is to be performed, the same result as that of an original function convolution may be acquired as represented by Equation 1, below:

$$f*g = \mathcal{F}^{-1}(\mathcal{F}_{(f)} \cdot \mathcal{F}_{(g)}) \qquad \text{Equation 1}$$

Referring to Equation 1, if an operation is performed in a frequency domain without performing a convolution in a time domain, a number of multiplications may decrease, which may lead to achieving an increase in the entire operation's processing speed and an enhancement in power efficiency for the entire operation.

Referring to the example of FIG. 2, a typical 1D convolution operation method may perform a convolution operation on 4 pieces of input data $k_0$, $k_1$, $k_2$, and $k_3$ and 3 pieces of filter data $w_0$, $w_1$, and $w_2$ and may output 2 pieces of output data $r_0$ and $r_1$ as represented by Equation 2, below:

$$r_0 = (k_0 \cdot w_0) + (k_1 \cdot w_1) + (k_2 \cdot w_2)$$

$$r_1 = (k_1 \cdot w_0) + (k_2 \cdot w_1) + (k_3 \cdot w_2) \qquad \text{Equation 2}$$

Referring to Equation 2, the alternative 1D convolution operation method may use 6 multiplications.

According to a Winograd algorithm as represented by Equation 3, output data may be modified and represented using a combination of $m_0$ to $m_4$, where Equation 3 is presented, below:

$$F(2, 3) = \underbrace{\begin{pmatrix} k_0 & k_1 & k_2 \\ k_1 & k_2 & k_3 \end{pmatrix}}_{2 \times 3} \underbrace{\begin{pmatrix} w_0 \\ w_1 \\ w_2 \end{pmatrix}}_{3 \times 1} = \underbrace{\begin{pmatrix} m_0 + m_1 + m_2 \\ m_1 - m_2 - m_3 \end{pmatrix}}_{2 \times 1} \qquad \text{Equation 3}$$

F(m, n) is a notation indicating processing having m pieces of output data and n pieces of filter data using a convolution operation-based finite impulse response (FIR)

filter. Here, $m_0$ to $m_4$ may be represented by Equation 4, below:

$$m_0 = (k_0 - k_2) \cdot w_0$$
$$m_1 = (k_1 + k_2) \cdot \frac{w_0 + w_1 + w_2}{2}$$
$$m_3 = (k_1 - k_3) \cdot w_2$$
$$m_2 = (k_2 - k_1) \cdot \frac{w_0 - w_1 + w_2}{2}$$

Equation 4

The 1D convolution operation according to a Winograd algorithm may use 4 multiplications. That is, a number of multiplications is reduced further compared to 6 multiplications used for the alternative method.

In general, the method of performing the 1D convolution operation according to a Winograd algorithm may include four stages: a first stage of transforming the input data $k_0$, $k_1$, $k_2$, and $k_3$ to $k_0-k_2$, $k_1+k_2$, $k_1-k_3$, and $k_2-k_1$; a second stage of transforming the filter data $w_0$, $w_1$, and $w_2$ to ($w_0$, $w_0+w_1+w_2$)/2 and ($w_2$, $w_0-w_1+w_2$)/2; a third stage of computing $m_0$ to $m_3$ by performing an elementwise multiplication on the transformed input data and the transformed filter data; and a fourth stage of outputting the output data $r_0$ and $r_1$ using $m_0$ to $m_3$. These four stages may be arranged as represented by Equation 5, below:

$$S = A^T[(Gw^T) \odot (C^T k^T)]$$

Equation 5

In Equation 5, $S=(r_0, r_1)$, $w=(w_0, w_1, w_2)$, and $k=(k_0, k_1, k_2, k_3)$.

The first stage of transforming the input data $k_0$, $k_1$, $k_2$, and $k_3$ to $k_0-k_2$, $k_1+k_2$, $k_1-k_3$, and $k_2-k_1$ may correspond to performing $(C^T k^T)$ of Equation 5. In such an example, C denotes an input transform matrix for transforming input data and may be represented by Equation 6, below:

$$C = \begin{bmatrix} 1 & 0 & -1 & 0 \\ 0 & 1 & 1 & 0 \\ 0 & -1 & 1 & 0 \\ 0 & 1 & 0 & -1 \end{bmatrix}$$

Equation 6

The second stage of transforming the filter data $w_0$, $w_1$, and $w_2$ to ($w_0$, $w_0+w_1+w_2$)/2 and ($w_2$, $w_0-w_1+w_2$)/2 may corresponds to performing $(Gw^T)$ of Equation 5. In such an example, G denotes a filter transform matrix for transforming filter data and may be represented by Equation 7, below:

$$G = \begin{bmatrix} 1 & 0 & 0 \\ \frac{1}{2} & \frac{1}{2} & \frac{1}{2} \\ \frac{1}{2} & -\frac{1}{2} & \frac{1}{2} \\ 0 & 0 & 1 \end{bmatrix}$$

Equation 7

The third stage of computing $m_0$ to $m_3$ by performing the elementwise multiplication on the transformed input data and the transformed filter data may correspond to outputting intermediate output data by performing a calculation according to $(Gw^T) \odot (C^T k^T)$ of Equation 5 and may correspond to performing the multiplication in the frequency domain according to Equation 1. Performing the elementwise multiplication may represent performing an operation of multiplying elements present at the same position in two matrices.

The fourth stage of outputting the output data $r_0$ and $r_1$ using $m_0$ to $m_3$ may correspond to performing a multiplication between $A^T$ and $(Gw^T) \odot (C^T k^T)$ of Equation 5, and may correspond to transforming a result of the frequency domain to the time domain in Equation 1. In such an example, A denotes n output transform matrix for transforming the intermediate output data and may be represented by Equation 8, below:

$$A = \begin{bmatrix} 1 & 0 \\ 1 & 1 \\ 1 & -1 \\ 0 & -1 \end{bmatrix}$$

Equation 8

The first stage of transforming the input data $k_0$, $k_1$, $k_2$, and $k_3$ to $k_0-k_2$, $k_1+k_2$, $k_1-k_3$, and $k_2-k_1$ and the second stage of transforming the filter data $w_0$, $w_1$, and $w_2$ to ($w_0$, $w_0-w_1+w_2$)/2 and ($w_2$, $w_0-w_1+w_2$)/2 may correspond to the aforementioned preprocessing process and the fourth stage of outputting the output data $r_0$ and $r_1$ using $m_0$ to $m_3$ may correspond to the aforementioned postprocessing process. The system according to such an example may perform the first stage and the second stage in the memory device 110, may perform the third stage in the high-speed operation processor 140, and may perform the fourth stage in the memory device 110 again.

Figure 3:
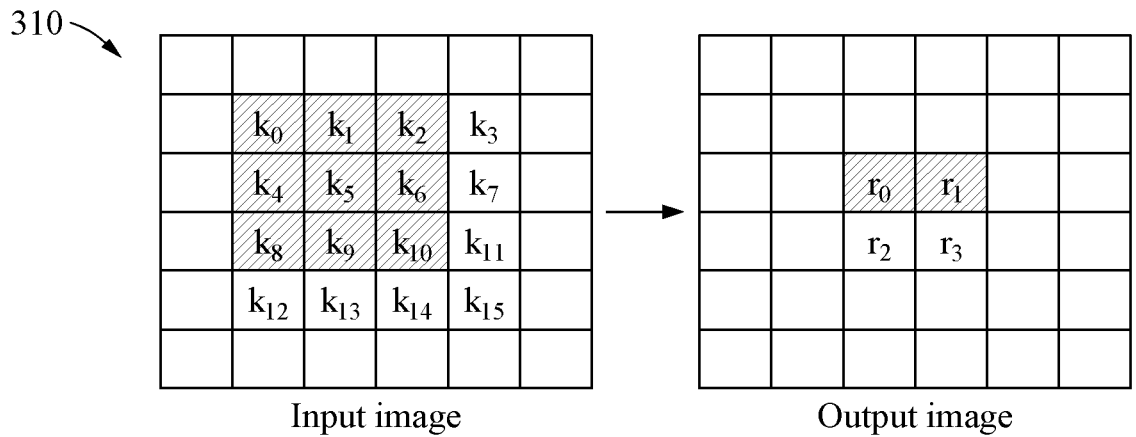
FIG. 3 illustrates an example Winograd algorithm according to a two-dimensional (2D) convolution operation.
Figure 3:
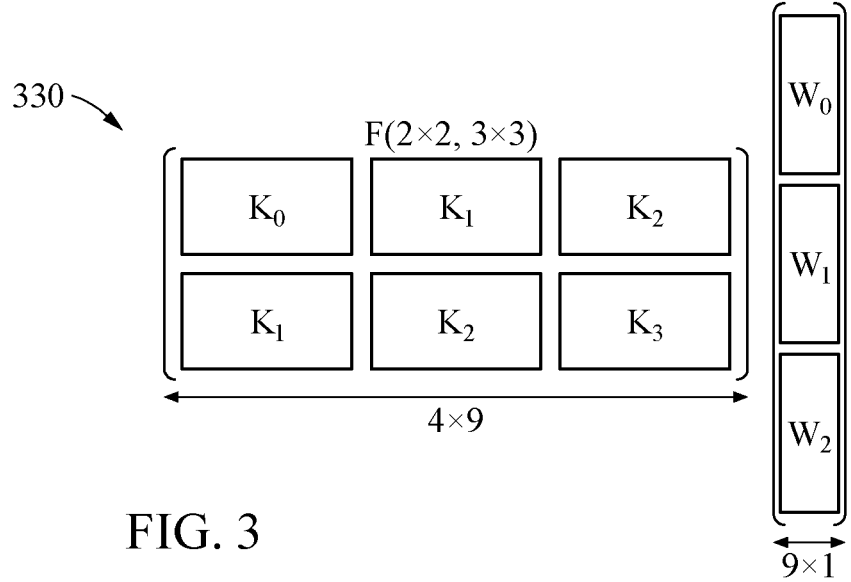

FIG. 3 illustrates an example of a Winograd algorithm according to a two-dimensional (2D) convolution operation.

Referring to indicators 310 and 320 of the example of FIG. 3, a typical 2D convolution operation may be performed by applying a 3×3 matrix, constituting a filter, to a 4×4 matrix of input data. In this example, 36 multiplications may be used.

A 2D convolution operation according to a Winograd algorithm may be performed by iterating a 1D convolution operation according to a Winograd algorithm twice, which may be represented by Equation 9, below:

$$S = A^T[((GwG^T) \odot M) \odot (C^T kC)]A$$

Equation 9

For example, referring to an indicator 330, in the case of applying a 3×3 filter to 4×4 input data, the 2D convolution operation according to a Winograd algorithm may be represented by Equation 10, and may use 16 multiplications only, where Equation 10 is provided below:

$$S = A^T[(GwG^T) \odot * C^T kC)]A$$

Equation 10

In such an example, an input transform matrix, a filter transform matrix, and an output transform matrix may be represented by Equation 11, Equation 12, and Equation 13, respectively, provided below:

$$C^T = \begin{bmatrix} 4 & 0 & -5 & 0 & 1 & 0 \\ 0 & -4 & -4 & 1 & 1 & 0 \\ 0 & 4 & -4 & -1 & 1 & 0 \\ 0 & -2 & -1 & 2 & 1 & 0 \\ 0 & 2 & -1 & -2 & 1 & 0 \\ 0 & 4 & 0 & -5 & 0 & 1 \end{bmatrix}$$

Equation 11

$$G = \begin{bmatrix} \frac{1}{4} & 0 & 0 \\ -\frac{1}{6} & -\frac{1}{6} & -\frac{1}{6} \\ -\frac{1}{6} & \frac{1}{6} & -\frac{1}{6} \\ \frac{1}{24} & \frac{1}{12} & \frac{1}{6} \\ \frac{1}{24} & -\frac{1}{12} & \frac{1}{6} \\ 0 & 0 & 1 \end{bmatrix} \quad \text{Equation 12}$$

$$A^T = \begin{bmatrix} 1 & 1 & 1 & 1 & 1 & 0 \\ 0 & 1 & -1 & 2 & -2 & 0 \\ 0 & 1 & 1 & 4 & 4 & 0 \\ 0 & 1 & -1 & 8 & -8 & 1 \end{bmatrix} \quad \text{Equation 13}$$

In the case of processing input data with a size of m×n using a filter with a size of r×s, the typical 2D convolution operation may use m·n·r·s multiplications and the 2D convolution operation according to a Winograd algorithm may use (m+r−1)(n+s−1) multiplications.

In the example of performing the convolution operation according to a Winograd algorithm, a number of matrix additions may increase, and a number of matrix multiplications may decrease accordingly. Through causing this tradeoff, it is possible to enhance the overall operation processing speed and to reduce a power consumption, in that the effect of the increase of matrix additions may be outweighed by the corresponding decrease in matrix multiplications.

Figure 4:
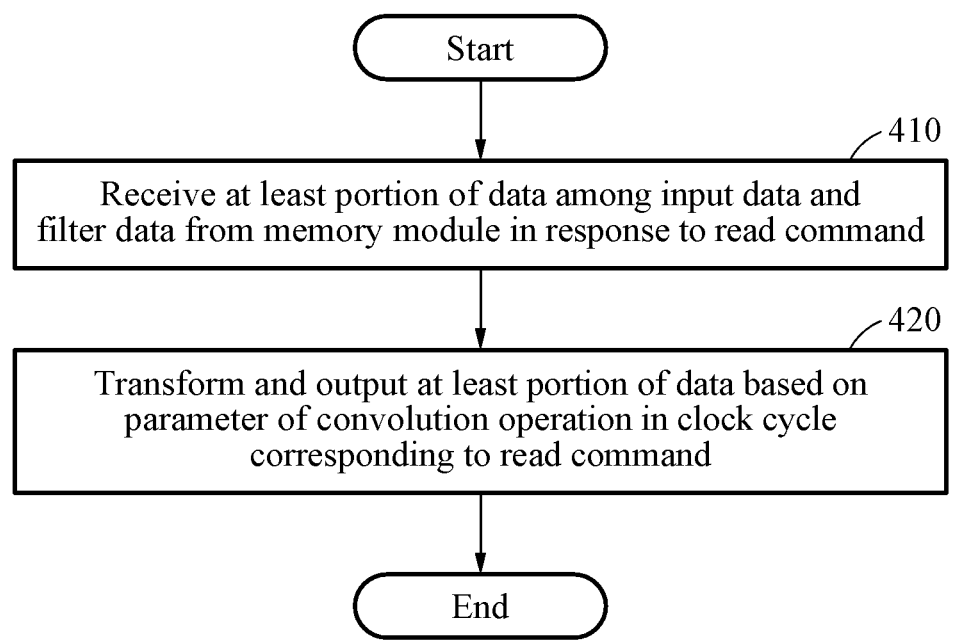
FIG. 4 is a flowchart illustrating example operations of a memory device.

FIG. 4 is a flowchart illustrating an example of an operation method of a memory device.

Referring to the example of FIG. 4, operations 410 and 420 may be performed by the memory device 110 of the example of FIG. 1. The operation method of the example of FIG. 4 may apply to any of systems that include a memory, for example, static random access memory (SRAM), dynamic random access memory (DRAM), parameter random access memory (PRAM), magnetic random access memory (MRAM), and flash memory, as non-limiting examples, regardless of a type of the memory.

In operation 410, the function module 130 may receive at least a portion of data from among input data and filter data from the memory cell 120, in response to a read command.

In operation 420, the function module 130 may transform and output the at least a portion of the data based on a parameter of the convolution operation in a clock cycle corresponding to the read command. The function module 130 may transform and output at least a portion of the input data based on an input transform matrix. For example, the function module 130 may include the input data transform circuit 131 designed to correspond to the input transform matrix, and the input data transform circuit 131 may transform the at least a portion of the input data and may output the transformed input data.

The input transform matrix may be determined based on a combination of the parameter of the convolution operation and a type of an algorithm that transforms the at least a portion of the input data. The parameter of the convolution operation may be determined based on any one or any combination of any two or more of a size of output data, a size of filter data, a size of input data, a stride interval, and a padding size, as non-limiting examples. The algorithm may refer to an algorithm that transforms data to reduce a multiplication complexity of the convolution operation. The aforementioned Winograd algorithm, Strassen algorithm, or modified algorithm thereof may be applied, as non-limiting examples. For example, in response to performing the convolution operation on F(2, 3) using a Winograd algorithm, the input transform matrix may be represented by Equation 6. Also, in response to performing the convolution operation on F(2×2, 3×3), the input transform matrix may be represented by Equation 11.

The function module 130 may transform and output at least a portion of the filter data based on a filter transform matrix. For example, the function module 130 may include the filter data transform circuit 133 designed to correspond to the filter transform matrix. The filter data transform circuit 133 may transform the at least a portion of the filter data and may output the transformed filter data. The filter transform matrix may be determined based on a combination of the parameter of the convolution operation and a type of an algorithm that transforms the at least a portion of the filter data. For example, in response to performing the convolution operation on F(2, 3) using a Winograd algorithm, the filter transform matrix may be represented by Equation 7. Also, in response to performing the convolution operation on F(2×2, 3×3), the filter transform matrix may be represented by Equation 12.

The memory device 110 may or may not employ the filter data transform circuit 133 using a multiplexer. For example, since the filter data does not often vary, the transformed filter data that is precomputed based on the filter transform matrix may be stored in the memory cell 120 and the memory device 110 may directly load and use the stored filter data using the multiplexer.

In response to a write command of at least a portion of intermediate output data that is output through an operation between the transformed input data and the transformed filter data, the function module 130 may transform the at least a portion of the intermediate output data based on the parameter of the convolution operation in a clock cycle corresponding to the write command and may store the transformed intermediate output data in the memory cell 120.

For example, the function module 130 may include the output data transform circuit 135 designed to correspond to the output transform matrix. The output data transform circuit 135 may transform the at least a portion of the intermediate output data and may output the output data. The output transform matrix may be determined based on a combination of the parameter of the convolution operation and a type of an algorithm that transforms the at least a portion of the intermediate output data. For example, in response to performing the convolution operation on F(2, 3) using a Winograd algorithm, the output transform matrix may be represented by Equation 8. Also, in response to performing the convolution operation on F(2×2, 3×3), the output transform matrix may be represented by Equation 13.

The function module 130 may perform preprocessing or postprocessing for the algorithm in the clock cycle corresponding to the read command or the write command. Preprocessing for the algorithm may include generating the transformed input data and/or transformed filter data, and postprocessing for the algorithm may include transforming the intermediate output data to the output data. Because the function module 130 is capable of performing preprocessing or postprocessing of the algorithm in the clock cycle corresponding to the read command or the write command, the system according to the example may reduce an amount of time used for preprocessing and postprocessing for the algorithm every cycle compared to the typical system.

If a single bus is shared by the input data and the output data, the memory device 110 may determine whether to use the input data transform circuit 131 or whether to use the output data transform circuit 135 based on a signal that identifies an input command or an output command. For example, if the bus is used as an input port based on the signal, the memory device 110 may use the input data transform circuit 131. By contrast, if the bus is used as an output port based on the signal, the memory device 110 may instead use the output data transform circuit 135.

The operation method of the memory device 110 capable of improving the operation speed of the convolution operation is described above in further detail with reference to the examples of FIGS. 1 to 4. Hereinafter, an overall configuration of a function module for improving an operation speed of a 1D convolution operation is described in further detail with reference to the examples of FIGS. 5 to 8, and an overall configuration of a function module for improving an operation speed of a 2D convolution operation is described in further detail with reference to the examples of FIGS. 10 to 15.

Figure 5:
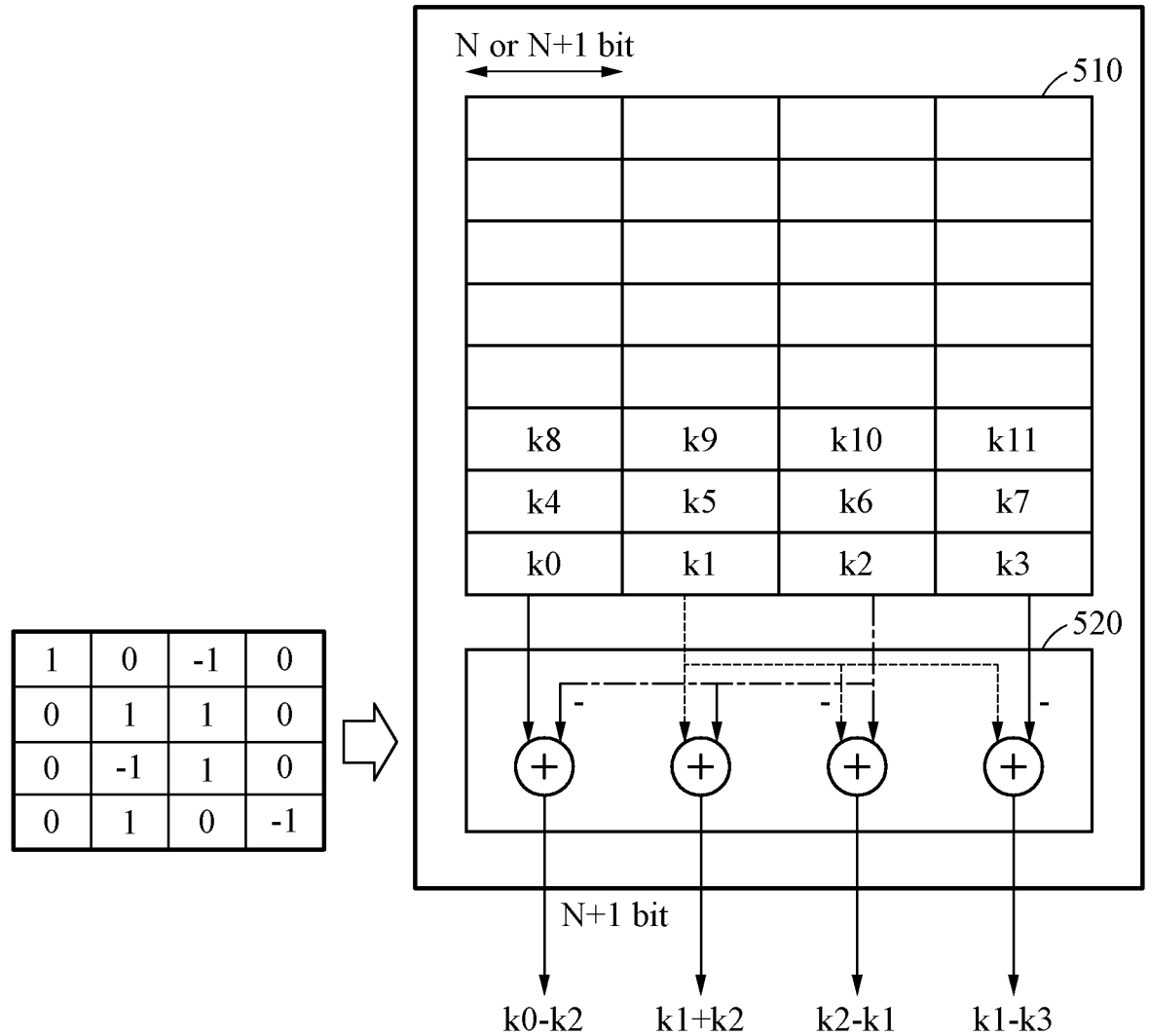
FIG. 5 illustrates an example memory device including an input data transform circuit for performing preprocessing of a 1D convolution operation according to a Winograd algorithm.

FIG. 5 illustrates an example of a memory device including an input data transform circuit for performing preprocessing of a 1D convolution operation according to a Winograd algorithm.

Referring to the example of FIG. 5, the memory device may include a memory cell 510 and a function module. The descriptions made above with reference to the examples of FIGS. 1 to 4 are applicable to the example of FIG. 5 and repeated description is omitted for brevity.

A system according to an example may perform a convolution operation on F(2, 3) using a Winograd algorithm. The memory cell 510 may store input data based on a 4 data unit that is a unit containing 4 pieces of data.

The function module may include an input data transform circuit 520. The input data transform circuit 520 may transform input data k0, k1, $k_2$, and k3 to k0−k2, k1+k2, k1−k3, and k2−k1. The input data transform circuit 520 may be designed to correspond to the input transform matrix of Equation 6. For example, the input data transform circuit 520 may be configured as a combination of adders corresponding to the input transform matrix. In the case of representing a negative number using 2's complement or 1's complement notation, an adder may be used as an adder-and-subtractor element.

The input data transform circuit 520 may have a sufficient speed to transform and output the input data in a clock cycle corresponding to a read command because the input data transform circuit 520 may be configured using only the combination of adders having a relatively simple configuration and a fast speed.

However, the input data transform circuit 520 of the example of FIG. 5 is provided as a non-limiting example only. Various circuits corresponding to the input transform matrix may operate as the input data transform circuit 520.

Figure 6:
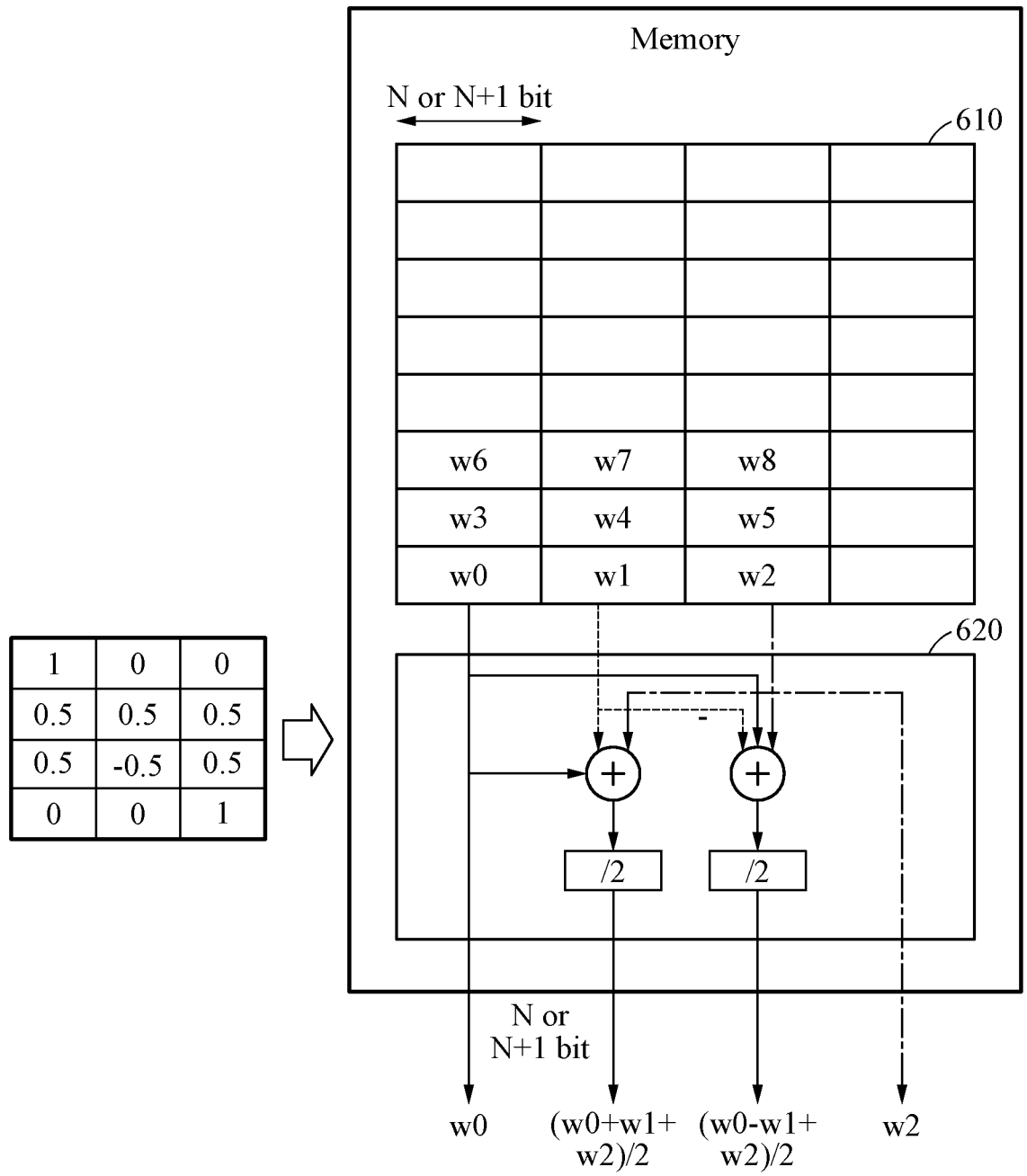
FIG. 6 illustrates an example memory device including a filter data transform circuit for performing preprocessing of a 1D convolution operation according to a Winograd algorithm.

FIG. 6 illustrates an example of a memory device including a filter data transform circuit for performing preprocessing of a 1D convolution operation according to a Winograd algorithm.

Referring to the example of FIG. 6, the memory device may include a memory cell 610 and a function module in a non-limiting example.

A system according to an example may perform a convolution operation on F(2, 3) using a Winograd algorithm. The memory cell 610 stores filter data based on a 3 data unit that is a unit of 3 pieces of data.

The function module may include a filter data transform circuit 620. The filter data transform circuit 620 may transform filter data w0, w1, and w2 to (w0, w0+w1+w2)/2 and (w2, w0−w1+w2)/2. The filter data transform circuit 620 may be designed to correspond to the filter transform matrix of Equation 7. For example, the filter data transform circuit 620 may be configured as a combination of a shifter and an adder corresponding to the filter transform matrix. A constant division may be performed using the shifter. In examples, the filter data may be referred to as a weight and the filter data transform circuit 620 may be referred to as a weight transform circuit.

The filter data transform circuit 620 may have a sufficient speed to transform and output the filter data during a clock cycle corresponding to a read command because the filter data transform circuit 620 may be configured using only the combination of the shifter and the adder, thus having a relatively simple configuration and a fast speed.

Here, the filter transform circuit 620 of the example of FIG. 6 is provided as a non-limiting example only. Various circuits corresponding to the filter transform matrix may operate in the role of the filter transform circuit 620, according to various non-limiting examples.

Figure 7:
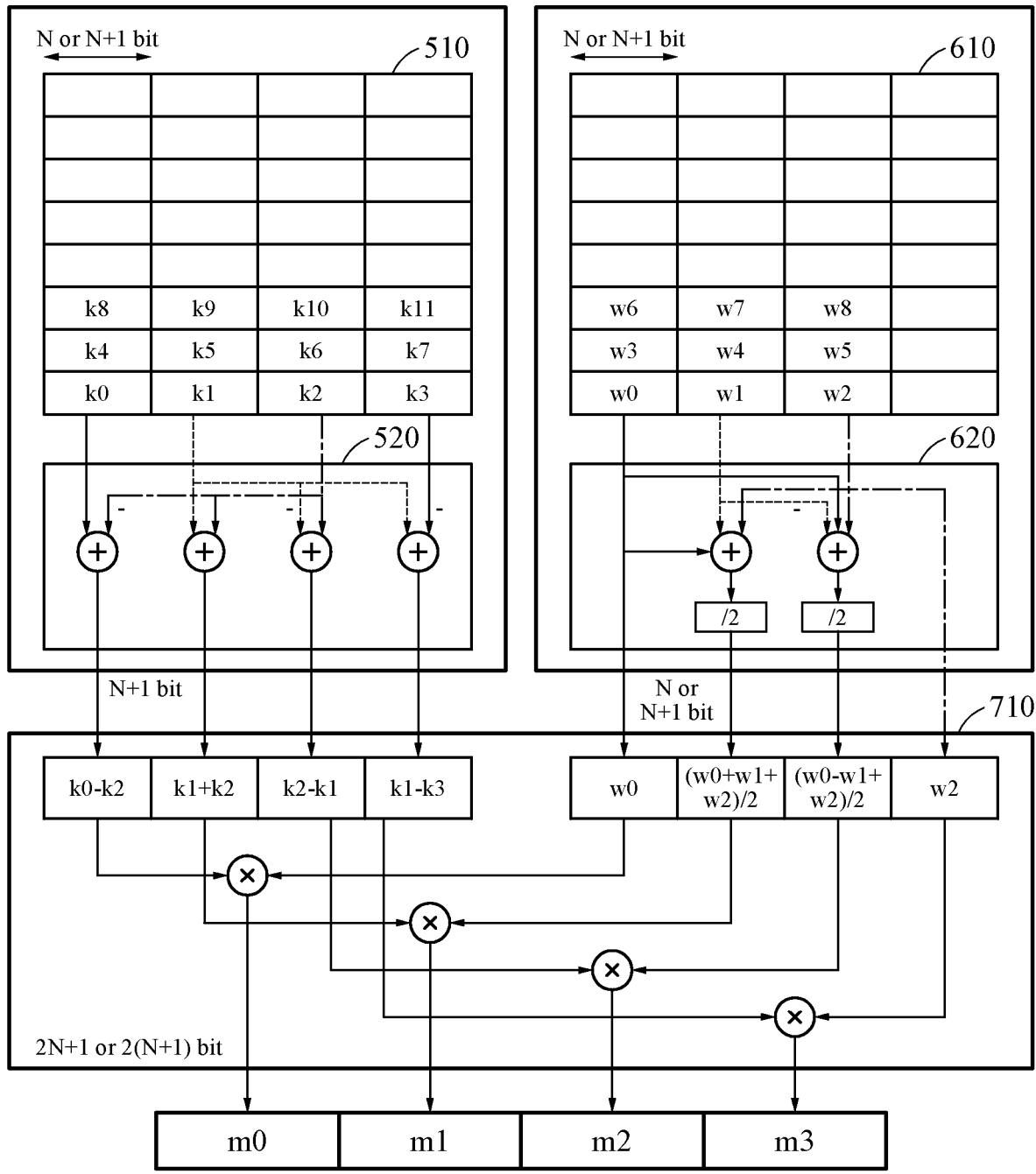
FIG. 7 illustrates an example system for performing a 1D convolution operation according to a Winograd algorithm.

FIG. 7 illustrates an example of a system for performing a 1D convolution operation according to a Winograd algorithm.

Referring to the example of FIG. 7, the system may include a high-speed operation processor 710, and the high-speed operation processor 710 may compute intermediate output data m0 to m3 by performing an elementwise multiplication on input data transformed through the input data transform circuit 520 and filter data transformed through the filter data transform circuit 620, as discussed in further detail, above. Here, m0 to m3 may be represented by Equation 4, as above.

In one non-limiting example, the high-speed operation processor 710 may be embedded in a memory device. For example, the high-speed operation processor 710 may be a multiplier. The multiplier may be embedded in the memory device and may also perform the elementwise multiplication on the transformed input data and the transformed filter data. Although FIG. 7 illustrates that the memory cell 510 and the memory cell 610 may be separate from each other, as a non-limiting example, it is also possible to simultaneously read input data and filter data using a single memory cell, as another non-limiting example. For example, when a memory interface is configured, data may be generally read based on a size unit of a data bus, for example, a number of lines of the data bus. In such an example, because a number of bits of individual input data or individual filter data may be less than the number of lines of the data bus, a plurality of pieces of data may be simultaneously read when reading data at a time, accordingly.

Alternatively, a number of channels of the data bus may increase. For example, in the non-limiting example of using two 4 GB DRAMs, as 2 channels, compared with using one 8 GB DRAM, as 1 channel, a size of the data bus may be doubled accordingly. In this non-limiting example, input data and filter data may be appropriately stored in both channels using a DMA module. A method of aligning and storing data is further described with reference to the example of FIG. 9.

Figure 8:
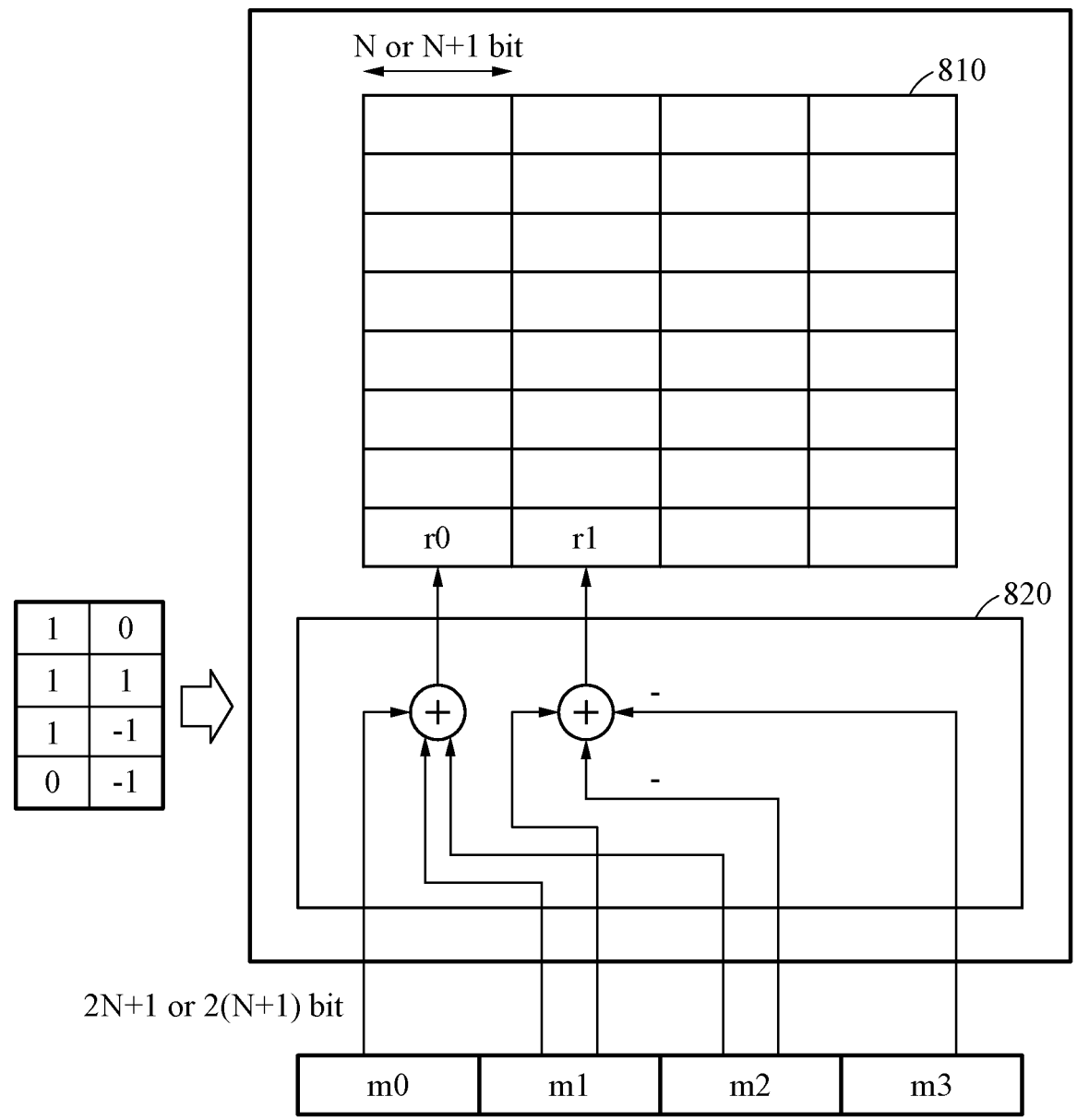
FIG. 8 illustrates an example memory device including an output data transform circuit for performing postprocessing of a 1D convolution operation according to a Winograd algorithm.

FIG. 8 illustrates an example of a memory device including an output data transform circuit for performing postprocessing of a 1D convolution operation according to a Winograd algorithm.

Referring to the example of FIG. 8, the memory device may include a memory cell 810 and a function module.

A system according to an example may perform a convolution operation on F(2, 3) using a Winograd algorithm. The memory cell 810 may store output data based on a 2 data unit that is a unit of 2 pieces of data.

The function module may include an output data transform circuit 820. The output data transform circuit 820 may transform intermediate output data m0, m1, m2, and m3 into r0 and r1. The output data r0 and r1 may be stored in the memory cell 810 after the transformation.

The output data transform circuit 820 may be designed to correspond to the output transform matrix of Equation 8. For example, the output data transform circuit 820 may be configured as a combination of adders corresponding to the output transform matrix, as a non-limiting example.

The output data transform circuit 820 may have a sufficient speed to transform and output the intermediate output data during a clock cycle corresponding to a write command because the output data transform circuit 820 may configured, in a non-limiting example, to use only the combination of adders, which may lead to a relatively simple configuration and a fast speed.

However, the output transform circuit 820 of the example of FIG. 8 is provided as a non-limiting example only. Various circuits corresponding to the output transform matrix may operate as the output transform circuit 820.

Although not illustrated, a memory device according to various non-limiting examples may include any one or any combination of any two or more of an input data transform circuit, a weight transform circuit, a multiplier, and an output data transform circuit. For example, the memory device may include one of the input data transform circuit, the weight transform circuit, the multiplier, and the output data transform circuit, or may include two or more of the input data transform circuit, the weight transform circuit, the multiplier, and the output data transform circuit. Depending on an example, the memory device may also include all of the input data transform circuit, the weight transform circuit, the multiplier, and the output data transform circuit.

In response to a request for an operation of a high frequency, an operation speed of the memory device may be improved through a pipelining scheme. For example, the memory device may process a memory read, an input data transform, a weight transform, a multiply, an output data transform, and a memory write using such a pipelining scheme. If an operation having a low frequency is available, the operation of the memory device may be processed during a single clock cycle without using pipelining.

The memory device may also include a port configured to stop a read/write signal to block a request from outside of the memory device. For example, the memory device may block the request from the outside by outputting a busy signal via the corresponding port.

The memory device may also include a counter configured to block a read/write during a specific period of time for the memory device. For example, the busy signal may be output during a period of time set by the counter. Accordingly, there may also be a corresponding period of time set by the counter during which the busy signal is not output.

The memory device may read a corresponding value from a region in which input and weight are stored and may perform input/output data transform operations, a multiply operation, and/or an output storage operation simultaneously or at a time interval, as non-limiting examples. For example, the aforementioned various operations may be implemented by performing read and write processing with different addresses using a dual port SRAM.

Figure 9:
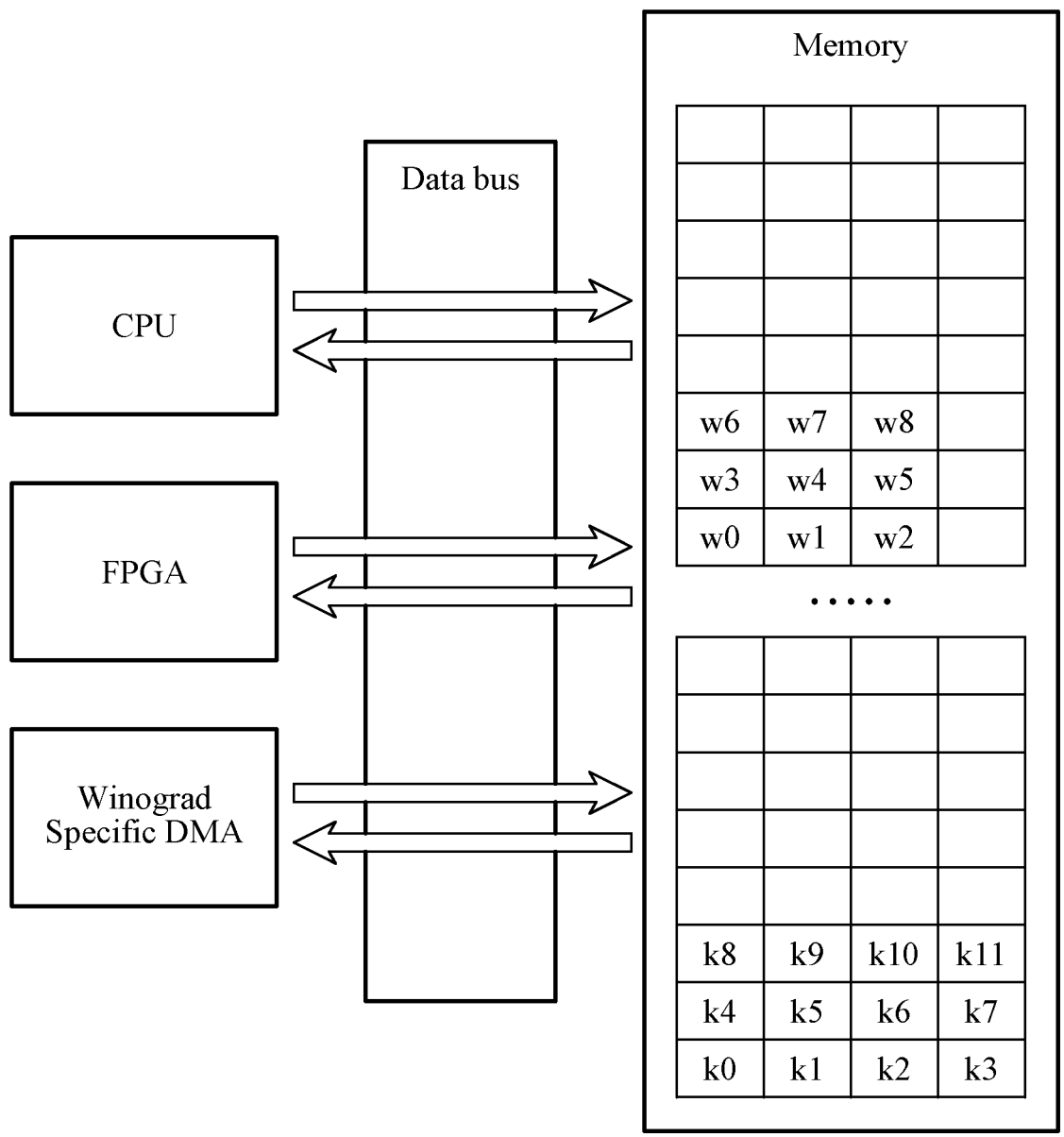
FIG. 9 illustrates an example method of aligning and storing data.

FIG. 9 illustrates an example of a method of aligning and storing data.

Referring to the example of FIG. 9, a system according to an example may further include a DMA module or device. The DMA device may refer to a piece of hardware and/or a combination of hardware and software that enables peripheral devices, for example, a hard disk, a graphic card, a network card, and a sound card, as non-limiting examples, to read or write a memory through direct access thereto and may be a function supported by an internal bus of a computer.

In one example, the DMA device may be used to align input data and filter data for performing a Winograd algorithm and to output data, accordingly. Before performing a Winograd algorithm processing using data, each piece of data needs to be aligned at a corresponding sequence by the DMA device.

In another example, a data moving function may be dynamically configured and used in an FPGA and may also be generated and used using an application-specific integrated circuit (ASIC). The data moving function may be performed by a CPU.

The DMA device or the FPGA may include a buffer internally. By using such a buffer, the DMA device or the FPGA may read a plurality of pieces of data and then may record the data at a desired memory position in a desired order.

Figure 10:
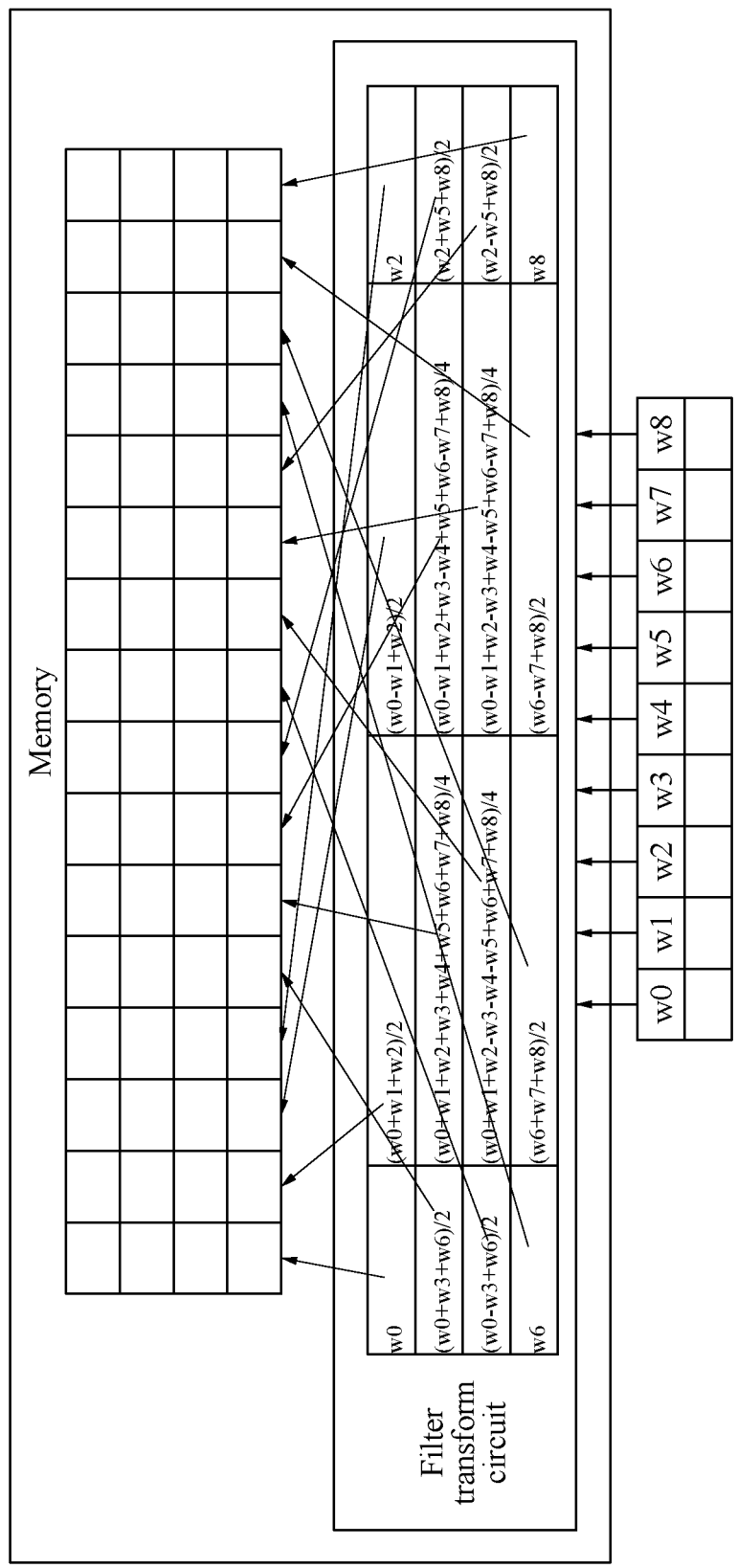
FIG. 10 illustrates an example method of transforming filter data for preprocessing of a 2D convolution operation according to a Winograd algorithm.

FIG. 10 illustrates an example of a method of transforming filter data for preprocessing of a 2D convolution operation according to a Winograd algorithm.

A memory device according to a non-limiting example may transform and output at least a portion of filter data in real time based on a filter transform matrix, or may store precomputed transformed filter data in a memory cell, according to another non-limiting example.

If filter data is reusable, the filter data may be transformed and stored in response to storing an initial filter data value. In this example, because additional computation is not required from a second use, it may be possible to save an amount of power used for computation and may be possible to reduce an amount of time used for a read command.

A system according to an example may perform a convolution operation on F(2×2, 3×3) using a Winograd algorithm. The memory device may transform filter data w0 to w8 through a function module and may store the transformed filter data in the memory cell.

In further detail, the filter data and the filter transform matrix may be represented by Equation 14 and Equation 15, respectively, below:

$$W = \begin{bmatrix} w0 & w1 & w2 \\ w3 & w4 & w5 \\ w6 & w7 & w8 \end{bmatrix} \quad \text{Equation 14}$$

$$G = \begin{bmatrix} 1 & 0 & 0 \\ 0.5 & 0.5 & 0.5 \\ 0.5 & -0.5 & 0.5 \\ 0 & 0 & 1 \end{bmatrix} \quad \text{Equation 15}$$

The transformed filter data may be acquired by performing ($GwG^T$) of Equation 10 and may be represented by Table 1, below:

TABLE 1

| w0 | (w0 + w1 + w2)/2 | (w0 − w1 + w2)/2 | w2 |
|---|---|---|---|
| (w0 + w3 + w6)/2 | (w0 + w1 + w2 + w3 + w4 + w5 + w6 + w7 + w8)/4 | (w0 − w1 + w2 + w3 − w4 + w5 + w6 − w7 + w8)/4 | (w2 + w5 + w8)/2 |
| (w0 − w3 + w6)/2 | (w0 + w1 + w2 − w3 − w4 − w5 + w6 + w7 + w8)/4 | (w0 − w1 + w2 − w3 + w4 − w5 + w6 − w7 + w8)/4 | (w2 − w5 + w8)/2 |
| w6 | (w6 + w7 + w8)/2 | (w6 − w7 + w8)/2 | w8 |

Referring to the example of FIG. 10, the memory device may transform the filter data w0 to w8 by using the function module and may pre-store the transformed filter data of Table 1 in the memory cell. Alternatively, the memory device may transform and output at least a portion of the filter data in real time based on using the filter transform matrix.

Figure 11:
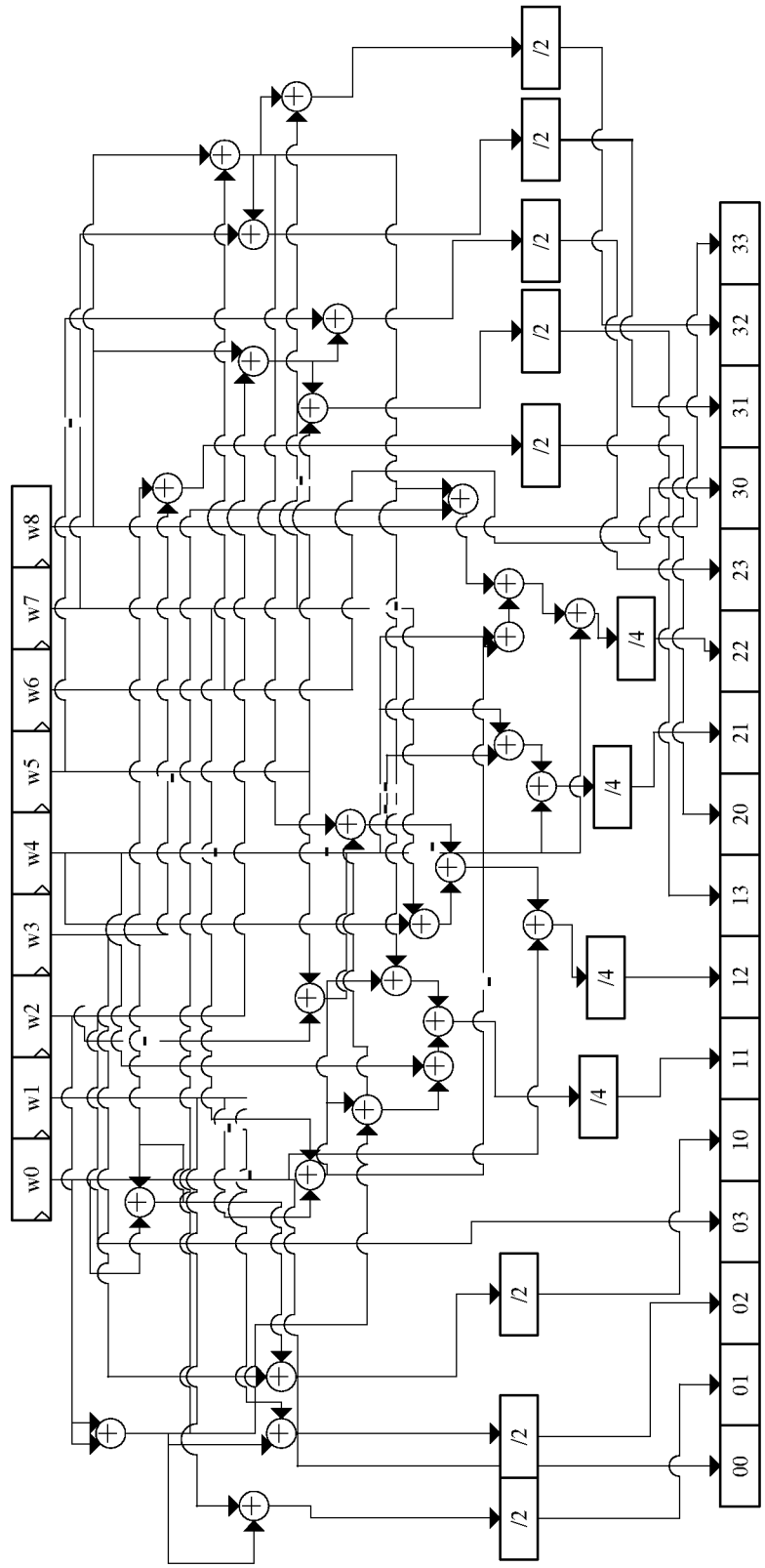
FIG. 11 illustrates an example filter data transform circuit for performing preprocessing of a 2D convolution operation according to a Winograd algorithm.

FIG. 11 illustrates an example of a filter data transform circuit for performing preprocessing of a 2D convolution operation according to a Winograd algorithm.

Referring to the example of FIG. 11, the filter data transform circuit may perform preprocessing on a filter data transform of a convolution operation performed on F(2×2, 3×3) using a Winograd algorithm. The filter data transform circuit may be designed to correspond to the filter transform matrix of the example of FIG. 10. For example, the filter data transform circuit may be configured as a combination of a shifter and an adder corresponding to the operations associated with the filter transform matrix. A constant division may be performed using the shifter, accordingly.

The filter data transform circuit may have a sufficient speed to transform and output the filter data during a clock cycle corresponding to a read command because the filter data transform circuit may be configured to use only the combination of the shifter and the adder, which may lead to the filter data transform circuit having a relatively simple configuration and a fast speed.

Here, the filter data transform circuit of the example of FIG. 11 is provided as a non-limiting example only. Various circuits corresponding to the filter transform matrix may operate as the filter data transform circuit, in other non-limiting examples.

Figure 12:
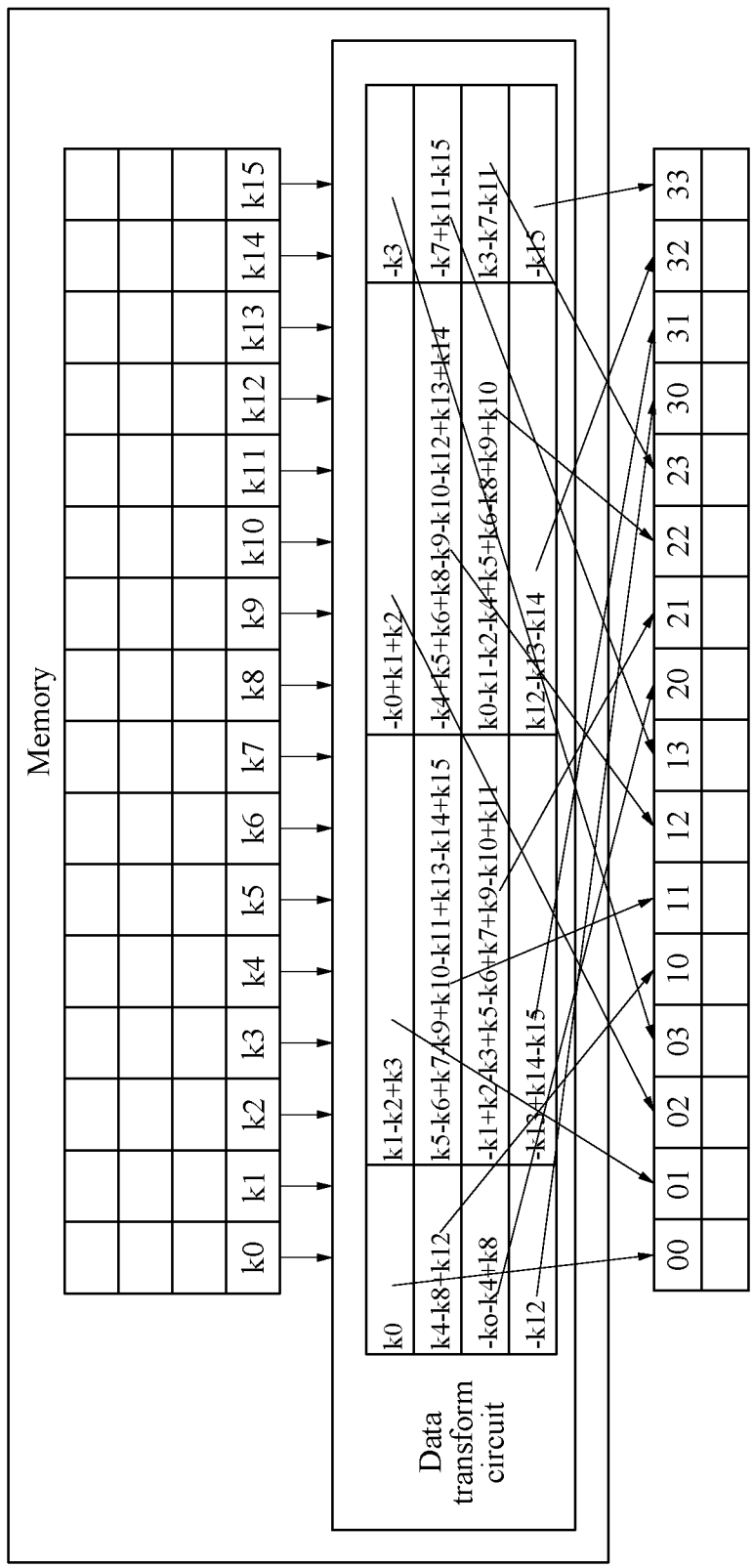
FIG. 12 illustrates an example transforming of input data for preprocessing of a 2D convolution operation according to a Winograd algorithm.

FIG. 12 illustrates an example of transforming input data for preprocessing of a 2D convolution operation according to a Winograd algorithm.

A system according to an example may perform a convolution operation on F(2×2, 3×3) using a Winograd algorithm. The memory device may transform and output input data k0 to k15 through using a function module.

In further detail, the input data and the input transform matrix may be represented by Equation 16 and Equation 17, respectively, below:

$$K = \begin{bmatrix} k0 & k1 & k2 & k3 \\ k4 & k5 & k6 & k7 \\ k8 & k9 & k10 & k11 \\ k12 & k13 & k14 & k15 \end{bmatrix} \quad \text{Equation 16}$$

$$C^T = \begin{bmatrix} 1 & 0 & 0 & 0 \\ 0 & 1 & -1 & 1 \\ -1 & 1 & 1 & 0 \\ 0 & 0 & 0 & -1 \end{bmatrix} \quad \text{Equation 17}$$

The transformed input data may be acquired by performing ($C^T kC$) of Equation 10 and may be represented by Table 2, below:

TABLE 2

| k0 | k1 − k2 + k3 | −k0 + k1 + k2 | −k3 |
|---|---|---|---|
| k4 − k8 + k12 | k5 − k6 + k7 − k9 + k10 − k11 + k13 − k14 + k15 | −k4 + k5 + k6 + k8 − k9 − k10 − k12 + k13 + k14 | −k7 + k11 − k15 |
| −k0 + K4 + K8 | −k1 + k2 − k3 + k5 − k6 + k7 + k9 − k10 + k11 | k0 − k1 − k2 − k4 + k5 + k6 − k8 + k9 + k10 | k3 − k7 − k11 |
| −k12 | −k13 + k14 − k15 | k12 − k13 − k14 | −k15 |

Referring to the example of FIG. 12, the memory device may transform and output input data of k0 to k15 by using a function module.

Figure 13:
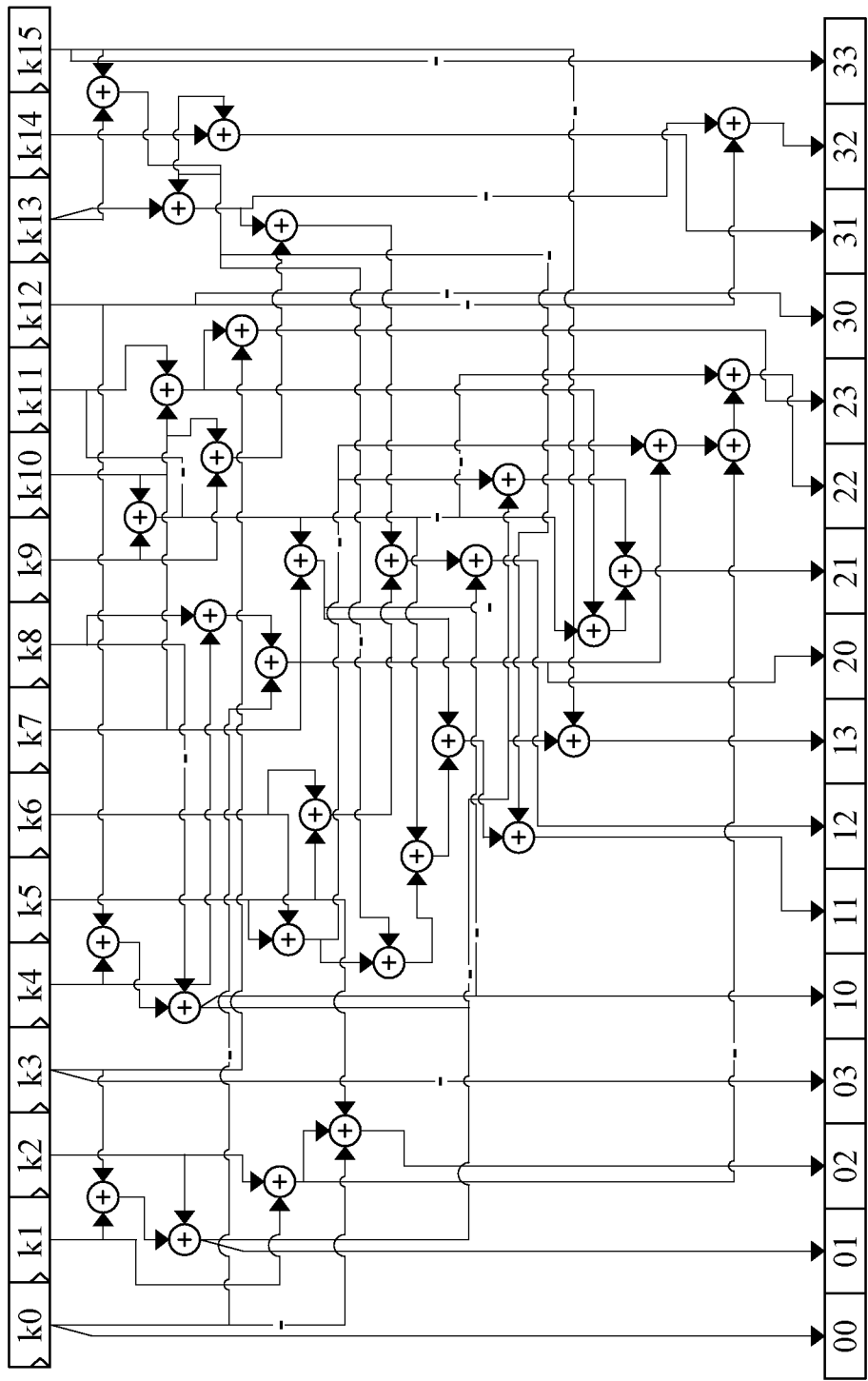
FIG. 13 illustrates an example input data transform circuit for performing preprocessing of a 2D convolution operation according to a Winograd algorithm.

FIG. 13 illustrates an example of an input data transform circuit for performing preprocessing of a 2D convolution operation according to a Winograd algorithm.

Referring to the example of FIG. 13, the input data transform circuit may perform preprocessing on an input data transform of a convolution operation to be performed on F(2×2, 3×3) using a Winograd algorithm. The input data transform circuit may be designed to correspond to the input transform matrix of the example of FIG. 12. For example, the input data transform circuit may be configured as a combination of adders corresponding to the input transform matrix, as a non-limiting example.

The input data transform circuit may have a sufficient speed to transform and output the input data during a clock cycle corresponding to a read command because the input data transform circuit may be configured to use only the combination of adders, thereby providing an input data transform circuit that may have a relatively simple configuration and a fast speed.

However, the input data transform circuit of the example of FIG. 13 is provided as a non-limiting example only. Various circuits corresponding to the input transform matrix may operate as the input data transform circuit, in other non-limiting examples.

Figure 14:
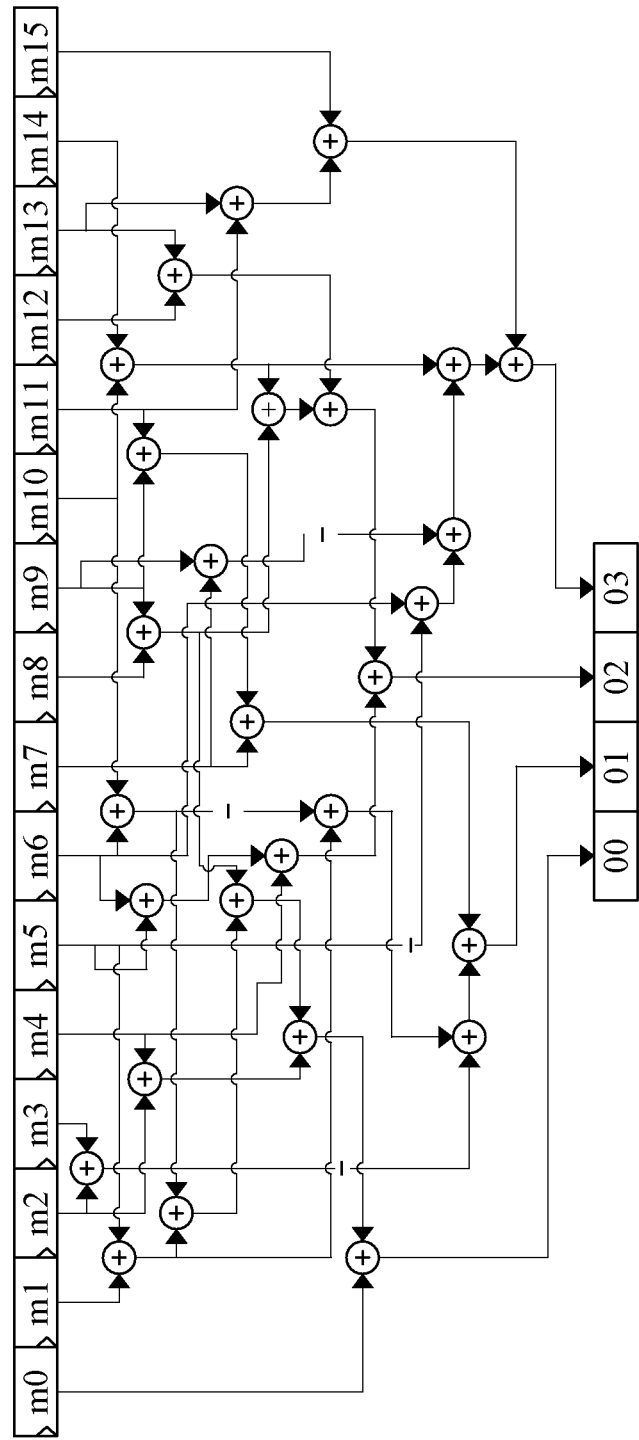
FIG. 14 illustrates an example system for performing a 2D convolution operation according to a Winograd algorithm.

FIG. 14 illustrates an example of a system for performing a 2D convolution operation according to a Winograd algorithm.

In one example, a high-speed operation processor may compute intermediate output data m0 to m15 by performing an elementwise multiplication on input data transformed through the input data transform circuit of the example of FIG. 11 and filter data transformed through the filter data transform circuit of the example of FIG. 13.

Referring to the example of FIG. 14, the function module may include an output data transform circuit. The output data transform circuit may transform the intermediate output data m0 to m15 to output data r0 to r4. The output data r0 to r4 may be stored in a memory cell once it is generated. In detail, the output data may be represented by Table 3, below:

TABLE 3

| | |
|---|---|
| m0 + m1 + m2 + m4 + m5 + m6 + m8 + m9 + m10 | m1 − m2 − m3 + m5 − m6 − m7 + m9 − m10 − m11 |
| m4 + m5 + m6 − m8 − m9 − m10 − m12 − m13 − m14 | m5 − m6 − m7 − m9 + m10 + m11 − m13 + m14 + m15 |

The output data transform circuit may be designed to correspond to an output transform matrix. For example, the output data transform circuit may be configured using a combination of adders corresponding to the operations associated with the output transform matrix, though this is a non-limiting example and other configurations may be used for the output data transform circuit in other examples.

The output data transform circuit may have a sufficient operational speed to be able to transform and output the intermediate output data during a clock cycle corresponding to a write command because the output data transform circuit may be configured to use only the combination of adders that have a relatively simple configuration and a fast speed.

Here, the output data transform circuit of the example of FIG. 14 is provided as a non-limiting example only. Various circuits corresponding to the output transform matrix may operate as the output data transform circuit, in other non-limiting examples.

Figure 15:
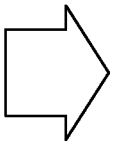
FIG. 15 illustrates an example method of reducing an information loss by a division.

FIG. 15 illustrates an example of a method of reducing information loss by a division.

In one example, because a filter transform matrix may be in a form of a rational number rather than an integer, a filter data transform circuit may need to be capable of performing a constant division using a shifter.

During a process during which the filter data transform circuit performs the constant division using the shifter, an information loss may occur. In one example, it may be possible to reduce the information loss occurring due to the division by adjusting a relationship between a filter transform matrix and an output transform matrix.

If an operation is performed without an information loss and then a division is performed, an information loss by the division may be further reduced by contrast with performing a convolution operation using data in which information is lost due to the division. In further detail, such that all of the elements of the filter transform matrix may become integers, intermediate output data may be computed using the filter transform matrix multiplied by a constant k and the intermediate output data may be transformed using the filter transform matrix divided by such a constant k.

Referring to the example of FIG. 15, a filter transform matrix in which all of the elements are integers may be generated by multiplying the filter transform matrix by 2, and intermediate output data may be computed using the filter transform matrix. The intermediate output data may be transformed using the filter transform matrix divided by 2. Through this approach, it may be possible to reduce an information loss occurring due to the division.

Figure 16:
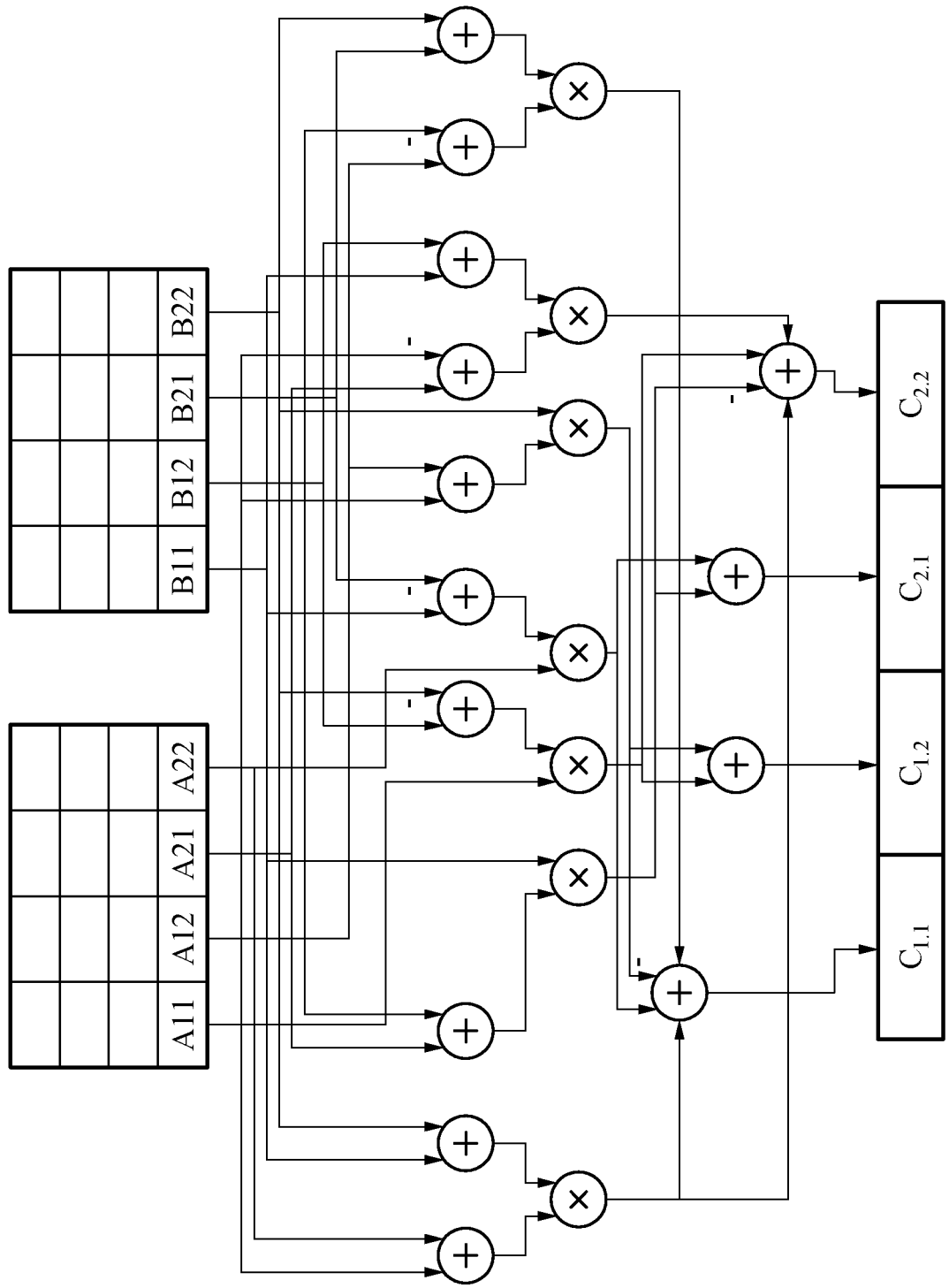
FIG. 16 illustrates an example operation method of a memory device according to a Strassen algorithm.

FIG. 16 illustrates an example of an operation method of a memory device according to a Strassen algorithm.

In one example, a Strassen algorithm refers to an algorithm capable of reducing a complexity of a matrix multiplication. If two matrices, each with a size of n×n, are multiplied, a time of about $O(n^3)$ may be used according to an alternative method. According to Strassen algorithm, a time of about $O(n^{2.807})$ may be used.

Referring to the example of FIG. 16, if a Strassen algorithm is applied, 8 multiplications may be reduced to 7 multiplications. Among intermediate operation results required to compute intermediate output data m1 to m7, an operation associated with A data, for example, input data, may be processed in a memory in which the A data is stored. Then an elementwise multiplication may be performed on the operation associated with the A data and an intermediate operation result of B data, for example, filter data. After storing the A data and the B data in a single memory, all of the operations shown in the example of FIG. 16 or a portion of the aforementioned operations may be processed in the memory. Operation results C1,1 to C2,2, which are output data, may use another storage space inside or outside the memory, in various non-limiting examples.

Figure 17:
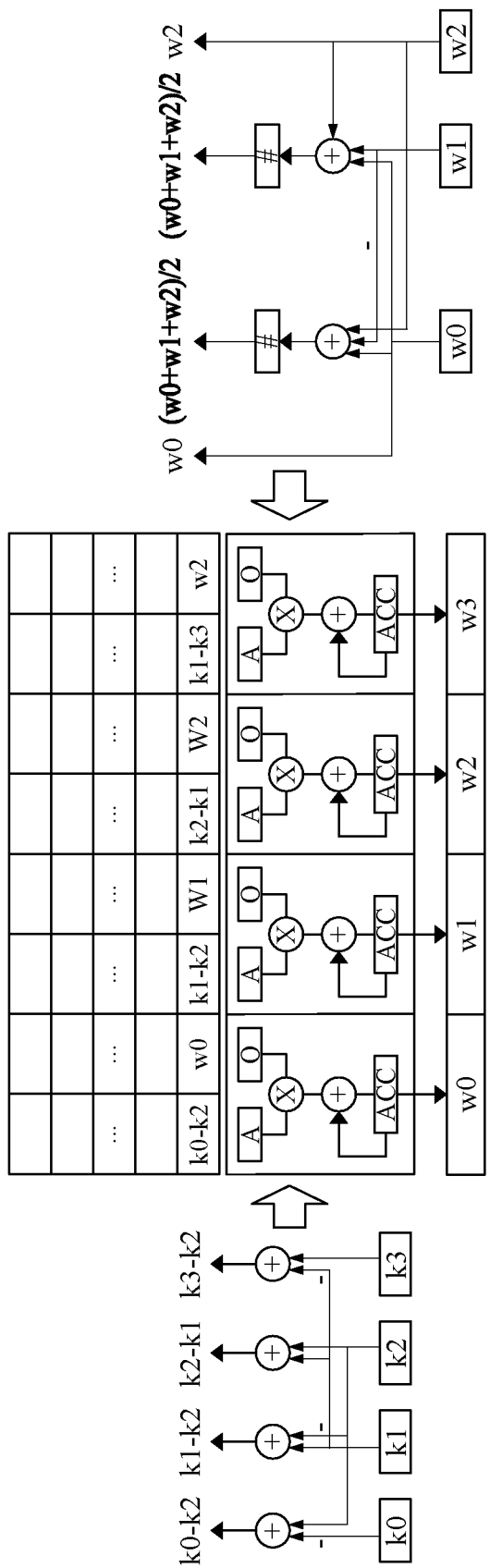
FIG. 17 illustrates an example operation method of a memory device including a multiplier accumulator (MAC).

FIG. 17 illustrates an example of an operation method of a memory device including a multiplier accumulator (MAC) unit, or simply MAC.

Referring to the example of FIG. 17, a memory device according to an example may include a MAC, and may also include any one or any combination of any two or more of an input data transform circuit, a filter data transform circuit, and an output data transform circuit, which are configured by selectively using a multiplier and an adder included in the MAC.

Alternatively, any one or any combination any two or more of the input data transform circuit, the filter data transform circuit, and the output data transform circuit may be configured by adding an additional multiplier and adder to the multiplier and the adder included in the MAC.

If a transform circuit is configured using the MAC as above, it is possible to configure the memory device capable of processing even a Winograd algorithm in addition to a general matrix-by-matrix multiplication, a matrix-by-vector multiplication, and a vector-by-vector multiplication.

Although not illustrated, if a size of transformed input data is less than or equal to a threshold, the function module may include a pruning circuit configured to output a predefined value.

For example, if a transformed value is less than or equal to a reference value when reading an input value of an algorithm from a memory cell through such a pruning circuit, the function module may output a value of 0 to an output port of a memory. The memory device may accordingly increase a processing speed by embedding the pruning circuit in the function module. The memory device may include a register configured to store such a pruning reference value in the memory.

The function module may further include a nonlinear function circuit configured to determine whether to activate transformed filter data. The memory device may increase a processing speed without an additional memory access by embedding such a nonlinear circuit in the function module. For example, the nonlinear function may include a rectified linear unit (ReLU) function, a modified ReLU function, a sigmoid function, a tan h function, as non-limiting examples of nonlinear functions used for deep learning.

Further, the nonlinear function may be processed at low power by providing a look-up table for use in the function module. A value absent from the look-up table may be interpolated, instead, by reading two values closest to the value from the look-up table, and estimating the value of the nonlinear function, such as by a local linear local approximation.

The memory device 110, memory cell 120, function module 130, input data transform circuit 131, filter data transform circuit 133, output data transform circuit 135, high-speed operation processor 140, memory cell 510, input data transform circuit 520, memory cell 610, filter data transform circuit 620, high-speed operation processor 710, memory cell 810, output data transform circuit 820, and MAC in FIGS. 1-17 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-17 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A memory device comprising:
a memory configured to store input data and filter data for a convolution operation; and
a function processor, embedded inside the memory device, configured to:
in response to a read command of at least a portion of data from among the input data and the filter data, transform at least a first portion of the input data using a first transforming matrix and transform at least a second portion of the filter data using a second transforming matrix, respectively during a clock cycle corresponding to the read command, the first transforming matrix and the second transforming matrix being respectively based on a parameter of the convolution operation, and output a corresponding transformation result, as transformed data, using a third transforming matrix; and
reduce information loss associated with the outputting by adjusting relationship between the second transforming matrix and the third transforming matrix.

2. The memory device of claim 1, wherein the function processor comprises an input data transform circuit configured to transform the at least first portion of the input data and output a corresponding transformation result as transformed input data, and
the input data transform circuit is structured based on the parameter of the convolution operation and a type of an algorithm applied to transform the at least first portion of the input data to reduce a computational quantity of the convolution operation.

3. The memory device of claim 2, wherein an input transform matrix is determined based on both the parameter of the convolution operation and the type of the algorithm, and
the input data transform circuit is structured to correspond to the input transform matrix.

4. The memory device of claim 1, wherein the function processor comprises a filter data transform circuit configured to transform the at least second portion of the filter data and output a corresponding transformation result as transformed filter data, and
the filter data transform circuit is structured based on the parameter of the convolution operation and a type of an algorithm applied to transform the at least second portion of the filter data to reduce a computational quantity of the convolution operation, and
wherein a filter transform matrix is determined, as the second transforming matrix, based on both the parameter of the convolution operation and the type of the algorithm, and the filter data transform circuit is structured to correspond to the filter transform matrix.

5. The memory device of claim 1, wherein the filter data stored in the memory comprises filter data transformed based on the parameter of the convolution operation, and
when the filter data is transformed based on the parameter of the convolution operation, the function processor is configured to output the transformed filter data without further transforming the transformed filter data.

6. The memory device of claim 1, wherein the function processor comprises a multiplier accumulator (MAC) configured to perform an operation between the transformed input data and the transformed filter data.

7. The memory device of claim 1, wherein the function processor is configured to, in response to a write command of at least a portion of intermediate output data that is output through an operation between the transformed input data and the transformed filter data, transform the at least portion of the intermediate output data based on the parameter of the convolution operation during a clock cycle corresponding to the write command, and output a corresponding transformation result as transformed intermediate output data.

8. The memory device of claim 7, wherein the intermediate output data comprises output data of an elementwise multiplication between the transformed input data and the transformed filter data.

9. The memory device of claim 7, wherein the function processor comprises an output data transform circuit configured to transform the at least portion of the intermediate output data and output a corresponding transformation result as transformed output data, and
the output data transform circuit is structured based on the parameter of the convolution operation and a type of an algorithm that transforms data to reduce a computational quantity of the convolution operation.

10. The memory device of claim 9, wherein the output transform matrix is determined based on the parameter of the convolution operation and the type of the algorithm, and the output data transform circuit is structured to correspond to the output transform matrix.

11. The memory device of claim 1, wherein the parameter of the convolution operation is determined based on any one or any combination of any two or more of a size of output data, a size of filter data, a size of input data, a stride interval, and a padding size.

12. The memory device of claim 1, wherein the function processor comprises either one or both of an adder and a shifter.

13. The memory device of claim 1, wherein an algorithm that transforms the input data to reduce a computational quantity of the convolution operation is a Winograd algorithm.

14. The memory device of claim 1, wherein the function processor is configured to output a predetermined value in response to a size of the transformed input data being less than or equal to a threshold.

15. The memory device of claim 1, wherein the function processor is configured to compute a value of a nonlinear function to determine whether to activate the transformed filter data.

16. The memory device of claim 1, wherein the function processor comprises an operation processor configured to perform an operation using the transformed input data and the transformed filter data.

17. The memory device of claim 16, wherein the operation processor comprises a multiplier configured to perform an elementwise multiplication using the transformed input data and the transformed filter data.

18. The memory device of claim 1, wherein the function processor comprises two or more of following circuit:
an input data transform circuit configured to transform the at least first portion of the input data and output a result of the transforming the at least first portion of the input data;
a filter data transform circuit configured to transform the at least second portion of the filter data and output a result of the transforming the at least second portion of the filter data;
a multiplier configured to perform a multiplication using the transformed input data and the transformed filter data; and
an output data transform circuit configured to transform at least a portion of intermediate output data output by performing the multiplication and output a result of the transforming the at least a portion of intermediate output data.

19. A computing apparatus comprising:
a memory configured to store input data and filter data for a convolution operation;
a function processor, embedded inside a memory device, configured to, in response to a read command of at least a portion of data from among the input data and the filter data, transform at least a first portion of the input data using a first transforming matrix and transform at least a second portion of the filter data using a second transforming matrix, respectively during a clock cycle corresponding to the read command, the first transforming matrix and the second transforming matrix being respectively based on a parameter of the convolution operation, and output a corresponding transformation result as transformed data; and
a direct memory access (DMA) processor configured to align and store the at least portion of the data in the memory based on a connection relationship between the memory and the function processor.

20. The computing apparatus of claim 19, wherein the function processor comprises an input data transform circuit configured to transform the at least first portion of the input data and output a corresponding transformation result as transformed input data, and
the input data transform circuit is structured based on the parameter of the convolution operation and a type of an algorithm applied to transform the at least first portion of the input data to reduce a computational quantity of the convolution operation.

21. The computing apparatus of claim 20, wherein an input transform matrix is determined based on a combination of the parameter of the convolution operation and the type of the algorithm, and
the input data transform circuit is structured to correspond to the input transform matrix.

22. The computing apparatus of claim 19, wherein the function processor comprises a filter data transform circuit configured to transform the at least second portion of the filter data and output a corresponding transformation result as transformed filter data, and
the filter data transform circuit is structured based on the parameter of the convolution operation and a type of an algorithm applied to transform the at least second portion of the filter data to reduce a computational quantity of the convolution operation.

23. The computing apparatus of claim 19, further comprising:
an operation processor configured to perform an operation using the transformed input data and the transformed filter data.

24. The computing apparatus of claim 23, wherein the operation processor comprises any one or any combination of any two or more of a central processing unit (CPU), a graphics processing unit (GPU), a digital signal processor (DSP), a neural processing unit (NPU), and a field programmable gate away (FPGA).

25. The computing apparatus of claim 19, wherein the function processor is configured to, in response to a write command of at least a portion of intermediate output data that is output through an operation using the transformed input data and the transformed filter data, transform the at least portion of the intermediate output data based on the parameter of the convolution operation during a clock cycle corresponding to the write command and output a corresponding transformation result as transformed intermediate output data.

26. The computing apparatus of claim 19, wherein the function processor comprises an output data transform circuit configured to transform at least a portion of the intermediate output data and output a corresponding transformation result as transformed intermediate output data, and
the output data transform circuit is structured based on the parameter of the convolution operation and a type of an algorithm that transforms the intermediate output data to reduce a computational quantity of the convolution operation.

27. A processor-implemented operation method of a memory device, the method comprising:
receiving at least a portion of data from among input data and filter data from a memory in response to a read command;

transforming, using one or more processor embedded inside the memory device, at least a first portion of the input data using a first transforming matrix and transforming, using the one or more processor, at least a second portion of the filter data using a second transforming matrix, respectively during a clock cycle corresponding to the read command, the first transforming matrix and the second transforming matrix being respectively based on a parameter of a convolution operation, and outputting a corresponding transformation result as transformed data, using a third transforming matrix; and reduce information loss associated with the outputting by adjusting relationship between the second transforming matrix and the third transforming matrix.

28. The method of claim 27, wherein the outputting comprises:
determining an input transform matrix based on a combination of the parameter of the convolution operation and a type of an algorithm that transforms the at least first portion of the input data to reduce a computational quantity of the convolution operation; and
transforming the at least first portion of the input data based on the input transform matrix and outputting a corresponding transformation result as transformed input data.

29. The method of claim 27, wherein the outputting comprises:
determining a filter transform matrix based on a combination of the parameter of the convolution operation and a type of an algorithm that transforms the at least second portion of the filter data to reduce a computational quantity of the convolution operation; and
transforming the at least second portion of the filter data based on the filter transform matrix and outputting a corresponding transformation result as transformed filter data.

30. The method of claim 27, further comprising:
in response to a write command of at least a portion of intermediate output data that is output through an operation between the transformed input data and the transformed filter data, transforming the at least portion of the intermediate output data based on the parameter of the convolution operation and storing the transformed at least portion of the intermediate output data in the memory during a clock cycle corresponding to the write command.

31. The method of claim 30, wherein the storing in the memory comprises:
determining an output transform matrix based on both the parameter of the convolution operation and a type of an algorithm that transforms the at least portion of the intermediate output data to reduce a computational quantity of the convolution operation; and
transforming the at least portion of the intermediate output data based on the output transform matrix and storing the same transformed at least portion of the intermediate output data in the memory.

32. A non-transitory computer-readable storage medium storing instructions that, when executed by one or more processors, cause the one or more processors to perform the method of claim 27.

33. A computing apparatus comprising:
one or more processors, embedded inside a memory, configured to:
in response to a read command of at least a portion of data among input data and filter data stored in the memory comprising a function-in-memory (FIM), transform at least a first portion of the input data using a first transforming matrix and transform at least a second portion of the filter data using a second transforming matrix, respectively during a clock cycle corresponding to the read command, the first transforming matrix and the second transforming matrix being respectively based on a parameter of the convolution operation, and output a corresponding transformation result as transformed data, using a third transforming matrix; and
reduce information loss associated with the outputting by adjusting relationship between the second transforming matrix and the third transforming matrix.

34. The computing apparatus of claim 33, wherein the memory is configured to store the input data and the filter data.

35. The computing apparatus of claim 34, further comprising a direct memory access (DMA) processor configured to align and store the at least portion of the data in the memory based on a connection relationship between the memory and the one or more processors.

36. The computing apparatus of claim 33, wherein the one or more processors comprise a multiplier accumulator (MAC) configured to perform an operation between the transformed input data and the transformed filter data.

* * * * *